United States Patent
Tsoi et al.

(10) Patent No.: US 9,843,250 B2
(45) Date of Patent: Dec. 12, 2017

(54) ELECTRO HYDRO DYNAMIC COOLING FOR HEAT SINK

(71) Applicant: Huawei Technologies Co., Ltd., Shenzhen, Guangdong (CN)

(72) Inventors: Vadim Tsoi, Kista (SE); Yake Fang, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/577,682

(22) Filed: Dec. 19, 2014

(65) Prior Publication Data
US 2016/0079840 A1    Mar. 17, 2016

Related U.S. Application Data

(63) Continuation of application No. PCT/EP2014/069703, filed on Sep. 16, 2014.

(51) Int. Cl.
*G05D 23/00* (2006.01)
*H02K 44/02* (2006.01)
*F04B 17/00* (2006.01)
*F25B 23/00* (2006.01)

(52) U.S. Cl.
CPC ............ *H02K 44/02* (2013.01); *F04B 17/00* (2013.01); *F25B 23/00* (2013.01); *F25B 2321/003* (2013.01); *F28F 2250/08* (2013.01)

(58) Field of Classification Search
CPC ...... H02K 44/02; F04B 17/00; F28F 2250/08; F28F 13/16; H01T 23/00; H05K 7/20; H05K 7/20209; H05K 9/0007; H05K 9/0064; F24H 3/022
USPC ................... 165/287, 80.3, 96, 185
See application file for complete search history.

(56) References Cited

U.S. PATENT DOCUMENTS

| | | | | |
|---|---|---|---|---|
| 2,949,550 A | * | 8/1960 | Townsend | H02N 11/006 244/62 |
| 3,187,087 A | * | 6/1965 | Leonhard | H02N 11/006 165/80.3 |
| 3,267,860 A | * | 8/1966 | Townsend | H02N 11/006 417/48 |

(Continued)

FOREIGN PATENT DOCUMENTS

| | | |
|---|---|---|
| CN | 101053291 A | 10/2007 |
| CN | 102264214 A | 11/2011 |

(Continued)

OTHER PUBLICATIONS

"ElectroHydroDynamic Thrusters (EHDT)," RMCybernetics—Elctropulsion, https://web.archive.org/web/20060207040936/http://www.rmcybernetics.com/science/propulsion/ehdt.htm (2006).

(Continued)

*Primary Examiner* — Travis Ruby
(74) *Attorney, Agent, or Firm* — Leydig, Voit & Mayer, Ltd.

(57) ABSTRACT

An Electro Hydro Dynamic, EHD, thruster (105) comprising a first set of electrodes (210), a second set of electrodes (220) and a supporting structure (103) for supporting the first set of electrodes (210) and the second set of electrodes (220). The EHD thruster (105) is configured to generate airflow of ionized air for cooling a heat sink (101). Further, the EHD thruster (105) is electrically isolated from the heat sink (101).

26 Claims, 15 Drawing Sheets

(56) References Cited

U.S. PATENT DOCUMENTS

| | | | | |
|---|---|---|---|---|
| 3,374,941 A * | 3/1968 | Carl | ................... | F04D 33/00 315/111.91 |
| 3,518,462 A * | 6/1970 | Brown | ................... | F15B 21/065 310/10 |
| 3,582,694 A * | 6/1971 | Gourdine | ................ | H02N 3/00 310/10 |
| 3,699,387 A * | 10/1972 | Edwards | ................ | H01T 14/00 310/308 |
| 3,751,715 A * | 8/1973 | Edwards | ................ | H01T 23/00 313/355 |
| 4,008,057 A * | 2/1977 | Gelfand | ................ | B03C 3/763 96/25 |
| 4,231,766 A * | 11/1980 | Spurgin | ................ | B03C 3/36 361/230 |
| 4,240,809 A * | 12/1980 | Elsbernd | ................ | B03C 3/78 239/752 |
| 4,351,648 A * | 9/1982 | Penney | ................ | B03C 3/38 96/77 |
| 4,643,745 A * | 2/1987 | Sakakibara | ............. | B03C 3/12 96/76 |
| 4,673,416 A * | 6/1987 | Sakakibara | ............. | B03C 3/12 96/79 |
| 4,689,056 A * | 8/1987 | Noguchi | ................ | B03C 3/12 96/79 |
| 4,719,535 A * | 1/1988 | Zhenjun | ................ | H01T 23/00 250/324 |
| 4,789,801 A * | 12/1988 | Lee | ................ | B03C 3/38 310/308 |
| 5,024,685 A * | 6/1991 | Torok | ................ | H01T 19/00 361/230 |
| 5,055,118 A * | 10/1991 | Nagoshi | ................ | B03C 3/60 96/77 |
| 5,077,500 A * | 12/1991 | Torok | ................ | H01T 23/00 250/324 |
| 5,461,540 A * | 10/1995 | Lee | ................ | G06F 1/20 165/185 |
| 5,707,428 A * | 1/1998 | Feldman | ................ | B03C 3/06 96/54 |
| 6,115,252 A * | 9/2000 | Ohta | ................ | G06F 1/203 165/80.4 |
| 6,504,308 B1 * | 1/2003 | Krichtafovitch | ........ | H01J 49/04 250/423 R |
| 6,522,536 B2 * | 2/2003 | Brewer | ............. | H05K 7/20727 165/80.3 |
| 6,919,698 B2 * | 7/2005 | Krichtafovitch | ........ | H05H 1/24 204/176 |
| 7,072,179 B1 * | 7/2006 | Curran | ................ | G06F 1/16 165/104.32 |
| 7,096,450 B2 * | 8/2006 | Gill | ................ | G06F 17/5077 174/262 |
| 7,122,070 B1 * | 10/2006 | Krichtafovitch | ........ | B03C 3/49 323/903 |
| 7,157,704 B2 * | 1/2007 | Krichtafovitch | ........ | H01T 19/00 250/324 |
| 7,159,646 B2 * | 1/2007 | Dessiatoun | ............ | H01M 14/00 165/104.23 |
| 7,190,587 B2 * | 3/2007 | Kim | ................ | H05K 7/20972 165/185 |
| 7,214,949 B2 * | 5/2007 | Schlitz | ................ | H05H 1/24 250/423 F |
| 7,269,008 B2 * | 9/2007 | Mongia | ................ | H01L 23/467 165/109.1 |
| 7,545,640 B2 * | 6/2009 | Fisher | ................ | F28F 13/16 29/592.1 |
| 7,553,353 B2 * | 6/2009 | Lepage | ................ | A61L 9/16 361/235 |
| 7,661,468 B2 * | 2/2010 | Schlitz | ................ | F04B 17/00 165/121 |
| 7,695,690 B2 * | 4/2010 | Taylor | ................ | B01D 53/32 422/121 |
| 7,830,643 B2 * | 11/2010 | DuBose | ................ | H05K 7/20172 361/225 |
| 7,839,634 B2 * | 11/2010 | Ouyang | ................ | F28F 13/16 165/104.33 |
| 8,139,354 B2 * | 3/2012 | June | ................ | G06F 1/206 165/109.1 |
| 8,305,728 B2 * | 11/2012 | Lee | ................ | F28F 13/16 361/231 |
| 8,342,234 B2 * | 1/2013 | Ouyang | ................ | F28F 13/02 165/104.34 |
| 8,411,435 B2 * | 4/2013 | Jewell-Larsen | ....... | F04B 19/006 165/109.1 |
| 8,508,908 B2 | 8/2013 | Jewell-Larsen | | |
| 8,610,160 B2 * | 12/2013 | Lee | ................ | F21K 9/135 257/99 |
| 8,712,598 B2 * | 4/2014 | Dighde | ............. | H04M 1/72563 361/688 |
| 8,807,204 B2 * | 8/2014 | June | ................ | H01L 23/467 165/104.33 |
| 8,824,142 B2 * | 9/2014 | Jewell-Larsen | ......... | G06F 1/203 165/104.33 |
| 2002/0122728 A1 * | 9/2002 | Darabi | ................... | H02N 1/008 417/48 |
| 2005/0023363 A1 | 2/2005 | Sharma et al. | | |
| 2005/0047056 A1 * | 3/2005 | Huang | ................ | G06F 1/16 361/212 |
| 2006/0005946 A1 * | 1/2006 | Borgstrom | ............. | F28F 13/16 165/96 |
| 2006/0054227 A1 * | 3/2006 | Sohn | ................ | F04B 19/006 137/831 |
| 2006/0061967 A1 * | 3/2006 | Kim | ................ | H05K 7/20972 361/704 |
| 2007/0020124 A1 * | 1/2007 | Singhal | ................ | F04B 43/043 417/413.2 |
| 2008/0302510 A1 | 12/2008 | Ouyang | | |
| 2009/0261268 A1 * | 10/2009 | Schwiebert | ............. | B03C 3/41 250/424 |
| 2010/0155025 A1 * | 6/2010 | Jewell-Larsen | ....... | F04B 19/006 165/96 |
| 2010/0177519 A1 * | 7/2010 | Schlitz | ................ | F04B 17/00 362/294 |
| 2010/0307724 A1 * | 12/2010 | Ichii | ................ | F28F 13/16 165/121 |
| 2011/0036552 A1 * | 2/2011 | Lu | ................ | B01D 53/8675 165/185 |
| 2011/0139401 A1 | 6/2011 | Huang et al. | | |
| 2011/0292560 A1 * | 12/2011 | Jewell-Larsen | ......... | G06F 1/203 361/231 |
| 2012/0002342 A1 | 1/2012 | Lee et al. | | |
| 2012/0008249 A1 * | 1/2012 | Sawyer | ................ | H01J 3/04 361/230 |
| 2012/0113590 A1 | 5/2012 | Schwiebert et al. | | |
| 2012/0119647 A1 | 5/2012 | Hsu | | |
| 2012/0120542 A1 | 5/2012 | Zhang et al. | | |
| 2012/0175663 A1 * | 7/2012 | Lee | ................ | F21K 9/135 257/99 |
| 2013/0116962 A1 | 5/2013 | Vestbostad et al. | | |
| 2014/0069909 A1 * | 3/2014 | Tang | ................ | H05B 1/0227 219/498 |
| 2014/0110278 A1 | 4/2014 | Sunderland | | |
| 2014/0177676 A1 | 6/2014 | Wu et al. | | |

FOREIGN PATENT DOCUMENTS

| | | |
|---|---|---|
| CN | 202995532 U | 6/2013 |
| CN | 103437879 A | 12/2013 |
| CN | 103717036 A | 4/2014 |
| CN | 103885870 A | 6/2014 |

OTHER PUBLICATIONS

De Bock et al., "Evaluation and Opportunities for Use of Thin Form Factor Synthetic Jets to Low Profile Electronics Cooling Applications," (Dec. 18, 2012).

\* cited by examiner

ELECTRO HYDRO DYNAMIC COOLING FOR HEAT SINK

CROSS-REFERENCE TO RELATED APPLICATIONS

This application is a continuation of International Patent Application No. PCT/EP2014/069703, filed on Sep. 16, 2014, which is hereby incorporated by reference in its entirety.

TECHNICAL FIELD

Implementations described herein relate generally to an Electro Hydro Dynamic (EHD) thruster, a method for controlling airflow generation of the EHD thruster and a system for cooling. The EHD thruster is configured to generate airflow of ionised air for cooling a heat sink, wherein the EHD thruster is electrically isolated from the heat sink.

BACKGROUND

Present Remote Radio Units (RRUs) on the telecom market are normally cooled down through Natural Convection Cooling (NCC) of a heat sink. The solutions discussed herein are exemplified by applications at first hand in conjunction with RRUs. This is however no limitation of the herein provided solutions for enhanced cooling.

The heat sink is typically thermally connected to a heat source for which cooling is crucial, such as a power amplifier of a RRU. The heat sink may typically be made of a heat conducting material such as e.g. copper, aluminium or an alloy comprising any of these or other heat conducting metal. Further, the heat sink may comprise a heat sink base and heat sink fins in order to increase the surface area of the heat sink and thereby the interface area between the heat sink and the environment, available for natural convection. An arbitrary example of such previously known heat sink is schematically illustrated in FIG. 9.

Natural convection cooling is reliable, does not require maintenance or electricity consumption as it has no moving parts and is completely silent.

A disadvantage however with natural convection cooling is the limited cooling capacity (limited to about 20 W/L), which thereby also puts a limit on the transmission capacity of an RRU.

Another disadvantage with natural convection cooling is that natural convection is very low when the RRU is applied indoors, even if most RRUs are mounted outdoors, typically on an elevated location such as a tower, a pole or the roof or wall of a building.

Also, the cooling effect of the heat sink is proportional to the size of the heat sink surface area. A compact design of the RRU and the heat sink is normally desired.

Due to escalating demands for radio capacity of wireless telecommunications, the increase of radio capacity of the RRU is a very important issue for any telecom equipment provider. However, with increased radio capacity of the RRU, normally also the heat generation of the RRU, e.g. of comprised power amplifiers and other components will increase, leading to an increased need for improved heat dissipation.

Increased cooling capacity of the RRU is very important for reliable expanding of mobile network supporting modern 3G, 4G and in future 5G mobile communication standards.

To overcome such limitation in cooling capacity, the convection may be increased by using one or more fans to move air across the surface of the heat sink. An example of such known heat sink with fan-enhanced convection is illustrated in FIG. 10.

However, cooling systems based on conventional fans have many disadvantages.

A main problem of such fan cooling solution is the limited reliability and expected lifetime of the fan. Also the bearings of the rotating fan have a limited lifetime, which bring additional manual maintenance requirements. As stated above, RRUs are typically mounted on elevated location such as towers etc., which makes human maintenance inconvenient, time consuming and dangerous.

Also, the rotating fan causes an aerodynamic noise as well as operating sound of the fan itself, which may be more or less obtrusive. Rotating fans sometimes generate a multitude of low frequency noise, which is often causing noise nuisance complaints.

In case of fan failure, noise and/or vibrations from the fan/bearings may increase and add even more noise pollution to the environment. Further, in case of fan failure natural convection cooling is not very well supported as the fan unit blocks the air flow of the heat sink. Thus a fan failure may lead to overheating of the RRU, or parts thereof.

In order to avoid or at least postpone fan failure and manual maintenance due to fan failure, two or more fans may be utilised for cooling the heat sink, providing some redundancy. However, thereby also the production costs increases.

These serious disadvantages of fan cooling results in that mobile operators increasingly often prefer natural convection cooling instead of fan cooling for their remote radio and other antenna close products, even if this limits the transmission capacity within the communication system.

It would for these reasons be desired to achieve a cooling system for cooling or thermal moderation, in particular for a heat source comprising radio equipment and/or sensitive electronic equipment, having the high reliability, low noise level, low costs, low demands for maintenance and low energy consumption of natural convection cooling, but having an increased cooling capacity, such as e.g. 30-40 W/L or more. It would also be desirable if such an improved cooling system could be mounted on existing heat sinks designed for fan cooling, in order not to have to change, or redesign the heat sink in order achieve the increased cooling capacity.

SUMMARY

It is therefore an object to obviate at least some of the above mentioned disadvantages and to improve the cooling performance when cooling a heat sink.

According to a first aspect, the object is achieved by an Electro Hydro Dynamic (EHD) thruster, comprising a first set of electrodes, a second set of electrodes and a supporting structure for supporting the first set of electrodes and the second set of electrodes. The EHD thruster is configured to generate airflow of ionised air for cooling a heat sink. The EHD thruster is electrically isolated from the heat sink.

Thereby, as the EHD thruster has no moving or rotating parts, a reliable and silent cooling mechanism is achieved for providing high capacity cooling of the heat sink. By keeping the EHD thruster electrically isolated from the heat sink, the risk of an accident is reduced.

In a first possible implementation of the EHD thruster according to the first aspect, the EHD thruster may be configured to generate a push airflow in a first direction through a first part of the heat sink and a pull airflow through a second part of the heat sink.

By placing the EHD thruster in a compartment within the heat sink, the EHD thruster is protected from unintentional contact or short cut of the electrodes comprised in the EHD thruster. Also, the push airflow may be directed towards a part of the heat sink that requires more cooling, while the pull airflow may be directed towards a part of the heat sink that cannot support push airflow, as other components or devices in said direction may be negatively affected by the heat brought by such push airflow.

In a second possible implementation of the EHD thruster according to the first aspect, or the first possible implementation thereof, the cooling airflow of the EHD thruster may be adjustable by adjusting Direct Currency (DC) voltage feed, based on an estimation of the temperature of a heat source thermally connected to the heat sink, and/or of the heat sink and/or of ambient temperature.

Thereby, the intensity of the generated cooling airflow and the cooling effect of the EHD thruster may be adapted according to the cooling requirements of the heat source/heat sink. Thereby the energy consumption of the EHD thruster may be reduced when the cooling requirements of the heat source/heat sink is low, i.e. below a predefined threshold level. The DC voltage feed may even be completely inhibited when the estimated temperature of the heat source/heat sink is below a certain predetermined threshold level limit, whereby no energy at all is consumed while the heat sink may be enabled to be cooled by natural convection cooling.

In a third possible implementation of the EHD thruster according to the first aspect, or any of the previously described possible implementations thereof, the first set of electrodes comprises one electrode or multiple parallel electrodes and the second set of electrodes comprises one electrode or multiple parallel electrodes, wherein the first set of electrodes is arranged in parallel or perpendicular to the second set of electrodes.

An advantage thereby is that flexible implementation of the EHD thruster is enabled, based on e.g. space constraints of the compartment where the EHD thruster is to be mounted, or production requirements for facilitating efficient manufacture.

In a fourth possible implementation of the EHD thruster according to the first aspect, or any of the previously described possible implementations thereof, any electrode within the first set of electrodes, or the second set of electrodes may be made of metal, or made of dielectric material such as plastic, covered by a metalized surface.

An advantage with producing any, some or all of the electrodes comprised in the first and/or second set of electrodes by covering a bar made of dielectrical material such as e.g. plastic and covering it by a metalized surface is that production costs may be reduced; weight of the EHD thruster may be reduced while improving corrosion properties.

In a fifth possible implementation of the EHD thruster according to the first aspect, or any of the previously described possible implementations thereof, the first set of electrodes may comprise at least one line electrode.

Thereby, the corona discharge ability of the line electrodes comprised in the first set of electrodes, functioning as ionisers is improved, leading to an improved airflow generation of the EHD thruster.

In a sixth possible implementation of the EHD thruster according to the first aspect, or any of the previously described possible implementations thereof, the second set of electrodes may comprise at least one line electrode arranged in parallel with the first set of electrodes.

An advantage thereby is that the corona discharge ability and capacity of the EHD thruster may be even further improved, leading to a further improved airflow generation of the EHD thruster.

In a seventh possible implementation of the EHD thruster according to the first aspect, or any of the previously described possible implementations thereof, the second set of electrodes may comprise at least one bar electrode arranged in parallel with the first set of electrodes.

An advantage therewith comprises enablement of a flexible implementation of the EHD thruster.

In an eighth possible implementation of the EHD thruster according to the first aspect, or any of the previously described possible implementations thereof, the first set of electrodes may comprise at least one electrode with at least one needle-like extrusion on an edge of the at least one electrode, directing towards the second set of electrodes.

An advantage thereby comprises that the corona discharge ability of the line electrodes comprised in the first set of electrodes may be even further improved by the at least one needle-like extrusion, leading to a further improved airflow generation of the EHD thruster.

In a ninth possible implementation of the EHD thruster according to the eighth possible implementation, the at least one needle-like extrusion of said at least one electrode in the first set of electrodes may be displaced with regard to the second set of electrodes, in the first direction of the created push airflow.

An advantage thereby is that the corona discharge ability and capacity of the EHD thruster may be even furthermore improved, leading to a further improved airflow generation of the EHD thruster.

In a tenth possible implementation of the EHD thruster according to the first aspect, or any of the previously described possible implementations thereof, the second set of electrodes may comprise at least one bar electrode arranged perpendicular to the first set of electrodes.

Thereby a flexible implementation is enabled.

In an eleventh possible implementation of the EHD thruster according to the first aspect, or any of the previously described possible implementations thereof, the second set of electrodes may comprise at least one line electrode arranged substantially perpendicular to the first set of electrodes.

Thereby a flexible implementation is enabled.

In a twelfth possible implementation of the EHD thruster according to the first aspect, or any of the previously described possible implementations thereof, the supporting structure may be open in the first direction towards the first part of the heat sink and may also be open in a second direction towards the second part of the heat sink, for enabling natural convection cooling of the heat sink when the EHD thruster is switched off.

Thereby the EHD thruster may be switched off when the heat sink cooling requirements may be satisfied by natural convection cooling of the heat sink, which saves energy and money.

In a thirteenth possible implementation of the EHD thruster according to the first aspect, or any of the previously described possible implementations thereof, the first set of electrodes may be connected to negative voltage and the second set of electrodes may be connected to either positive voltage or ground; or wherein the first set of electrodes may be connected to positive voltage and the second set of electrodes may be connected to either negative voltage or ground.

An advantage thereby is that the corona discharge ability and capacity of the EHD thruster may be even furthermore improved, leading to a further improved airflow generation of the EHD thruster, while a flexible implementation is enabled.

In a fourteenth possible implementation of the EHD thruster according to the first aspect, or any of the previously described possible implementations thereof, the second set of electrodes may be electrically grounded and comprised in the heat sink.

An advantage with those embodiments is that in some implementations, it may be required for safety reasons/legal reasons, that the heat sink is grounded, which reduces the risk of an accident.

In a fifteenth possible implementation of the EHD thruster according to the first aspect, or any of the previously described possible implementations thereof, the supporting structure may be electrically isolated from the first and second sets of electrodes and may be metalized for protecting nearby electronic equipment from electromagnetic interference.

An advantage with those embodiments is that in some implementations, it may be required for safety reasons/legal reasons, that the heat sink is grounded, which reduces the risk of an accident.

In a sixteenth possible implementation of the EHD thruster according to the first aspect, or any of the previously described possible implementations thereof, the supporting structure may comprise at least one grid for enclosing the first set of electrodes and/or the second set of electrodes while enabling natural convection cooling of the heat sink by allowing airflow through the supporting structure.

Thereby the EHD thruster may be switched off when the heat sink cooling requirements may be satisfied by natural convection cooling of the heat sink, which saves energy and costs.

According to a second aspect, the object is achieved by a method in a control unit for controlling airflow generation of an EHD thruster comprising a first set of electrodes, a second set of electrodes and a supporting structure for supporting the first set of electrodes and the second set of electrodes. The EHD thruster is configured to generate airflow of ionised air for cooling a heat sink. The method comprises estimating temperature of a heat source thermally connected to the heat sink to be cooled. Further, the method also comprises comparing the estimated temperature with a threshold limit. Also, the method in addition comprises adjusting the voltage feed level of a Direct Currency (DC) power supply unit to the first and second sets of electrodes, based on the comparison.

Thereby, as the EHD thruster has no moving or rotating parts, a reliable and silent cooling mechanism is achieved for providing high capacity cooling of the heat sink. By keeping the EHD thruster electrically isolated from the heat sink, the risk of an accident is reduced.

In a first possible implementation of the method according to the second aspect, the adjustment of the voltage feed level comprises generating pulse width modulation signals in the control unit and transmitting them to the DC power supply unit, which DC power supply unit thereby may be enabled to accordingly adjust DC current feed to the first and second sets of electrodes of the EHD thruster.

Thereby the EHD thruster may be switched off when the heat sink cooling requirements may be satisfied by natural convection cooling of the heat sink, which saves energy and costs.

In a second possible implementation of the method according to the second aspect, or the first possible implementation thereof, the airflow may comprise a pull airflow enabled by the EHD thruster, placed between the first part and the second part of the heat sink, by decreasing local air pressure resulting in a cold airstream through the heat sink.

By placing the EHD thruster in a compartment within the heat sink, the EHD thruster is protected from unintentional contact or short cut of the electrodes comprised in the EHD thruster. Also, the push airflow may be directed towards a part of the heat sink that requires more cooling, while the pull airflow may be directed towards a part of the heat sink that cannot support push airflow, as other components or devices in said direction may be negatively affected by the heat brought by such push airflow.

According to a third aspect, the object is achieved by a system comprising the EHD thruster according to the first aspect, or any of the previously described possible implementations thereof, which EHD thruster is configured for generating an airflow of ionised air. The system also comprises a heat sink. Further, the EHD thruster is electrically isolated from the heat sink.

Thereby, as the EHD thruster has no moving or rotating parts, a reliable and silent cooling mechanism is achieved for providing high capacity cooling of the heat sink. By keeping the EHD thruster electrically isolated from the heat sink, the risk of an accident is reduced.

In a first possible implementation of the system according to the third aspect, the heat sink may comprise a first part and a second part. The heat sink may be electrically grounded and wherein the heat sink may comprise a compartment for holding the EHD thruster according to the first aspect, or any of the previously described possible implementations thereof, for providing a push airflow in a first direction through the first part of the heat sink and a pull airflow through the second part of the heat sink.

In a second possible implementation of the system according to the third aspect, or the first possible implementation thereof, a DC power supply unit may be comprised. The DC power supply unit may be configured for providing a DC current to the first and second sets of electrodes of the EHD thruster.

Thereby a stable and reliable supply of DC high voltage current may be provided to the EHD thruster ensuring consistent operation of the EHD thruster without any unintentional interruptions.

In a third possible implementation of the system according to the third aspect, or any of the previously described possible implementation thereof, the DC power supply unit may be configured to convert from low voltage DC input to a variable high voltage DC output, where the level of high voltage DC output may be controlled by the control unit.

By converting into high voltage in the DC power supply unit, the DC power supply unit may be fed with low voltage, which is involving considerably less risks and dangers for personal injuries. Thereby a safer system is achieved.

In a fourth possible implementation of the system according to the third aspect, or any of the previously described possible implementation thereof, a short cut detector may be comprised. Further, the DC power supply unit may be configured to disable the voltage feed when a short cut behaviour is detected and to enable the voltage feed of the DC power supply unit when no short cut is detected.

Thereby a safer system is achieved, involving considerably less risks and dangers for personal injuries.

Thus the described aspects and implementations thereof provide an improved cooling performance of equipment.

The present solution may prevent device overheating, reduce thermal hotspots, provide desired thermal stability for temperature sensitive devices, improve long term reliability, provide a silent airflow, reduce energy consumption by enabling natural convection cooling of a heat sink, enable a compact design of the heat sink and also provide other benefits.

Other objects, advantages and novel features of the various implementation forms will become apparent from the subsequent detailed description.

BRIEF DESCRIPTION OF THE DRAWINGS

Various embodiments are described in more detail with reference to the attached drawings, illustrating examples of embodiments in which.

DETAILED DESCRIPTION

Embodiments of the invention described herein are defined as a Electro Hydro Dynamic (EHD) thruster and a method for controlling airflow generation of an EHD thruster and a system, which may be put into practice in the embodiments described below. These embodiments may, however, be exemplified and realised in many different forms and are not to be considered as limited to the embodiments set forth herein; rather, these embodiments are provided so that this disclosure will be thorough and complete.

Still other objects and features may become apparent from the following detailed description considered in conjunction with the accompanying drawings. It is to be understood, however, that the drawings are designed solely for purposes of illustration and not as a definition of the limits of the herein disclosed embodiments, for which reference is to be made to the appended claims. Further, the drawings are not necessarily drawn to scale and, unless otherwise indicated, they are merely intended to conceptually illustrate the structures and procedures described herein.

Figure 1A:
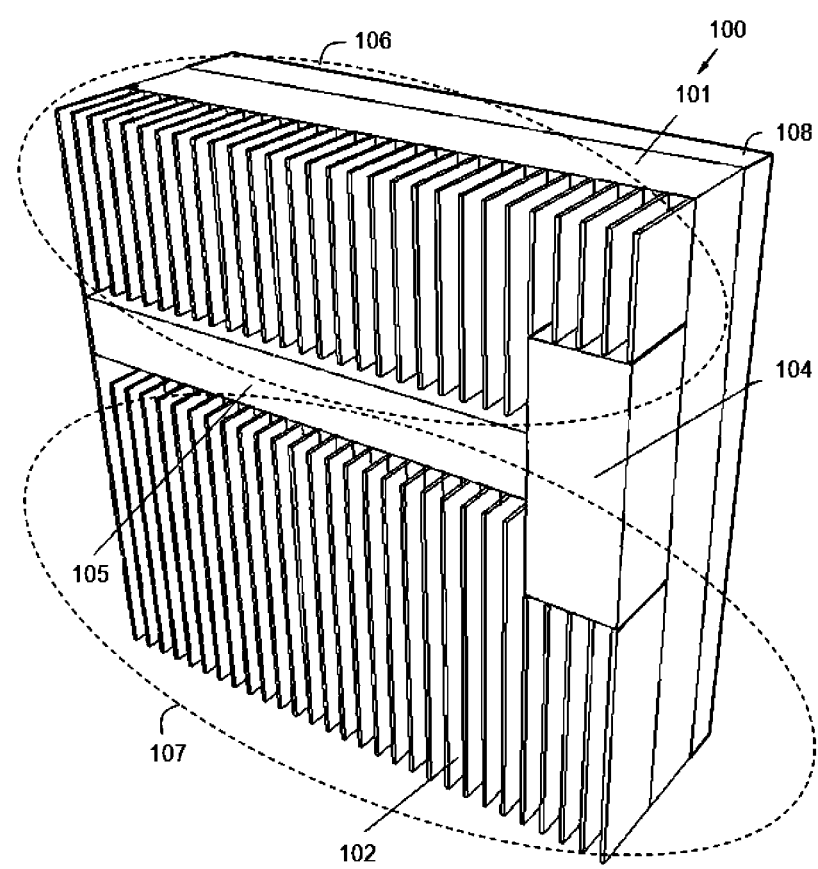
FIG. 1A is a block diagram illustrating a cooling system according to an embodiment.

FIG. 1A is a schematic illustration over a cooling system 100 for cooling a heat sink 101. The heat sink 101 may be thermally connected to a heat source 108, which may comprise e.g. electronic or mechanical equipment, telecommunication related equipment such as e.g. a Remote Radio Unit (RRU) or any other arbitrary equipment or unit which may be overheated.

The heat sink 101 may be made of aluminium, copper or an alloy comprising these and/or other similar metals and may comprise fins 102 for enhancing natural convection cooling by providing a large convective surface.

The heat sink 101 comprises a compartment for placing an Electro Hydro Dynamic (EHD) thruster 105. The EHD thruster 105 may comprise at least one first electrode, or ioniser as it also may be referred to, and at least one second electrode, sometimes referred to as a collector. The first and second electrodes of the EHD thruster 105 are comprised in a supporting structure 103 and may be fed with high voltage Direct Currency (DC) from a DC power source such as e.g. a DC power supply unit 104.

The EHD thruster 105 is an electro hydrodynamic device which ionises air and moves the charged ion cloud in a way and direction to transfer momentum to neutral air molecules. The EHD thruster 105 may in some embodiments be made up of two electrodes, one with a sharp edge, the ioniser and one with a smooth edge, the collector, which when powered by a high DC voltage (such as e.g. a few kV, for example in between 5-10 kV or similar) produces thrust against the surrounding medium, normally air. This is due to a corona discharge that occurs, which creates ions in a fluid (such as e.g. air) by the presence of a strong electric field. Electrons are torn from neutral air, and either the positive ions or the electrons are attracted to the conductor, while the charged particles drift.

The EHD thruster 105 works without moving parts, blows silently, uses only electrical energy and is able to generate sufficient airflow for enhancement of electronic cooling of the heat sink 101.

The physical phenomenon of the electro hydro dynamic corona discharge and the creation of airflow creation is per se well known and documented already in a book titled 'Physico-Mechanical Experiments on Various Subjects' by F. Hauksbee, printed 1709. Many other pioneers of electricity, including Newton, Faraday, and Maxwell, studied this phenomenon. However, very little practical implementation of this phenomenon has been exploited and none within the field of providing a cooling system 100 for cooling the heat source 108/heat sink 101 by a flow of ionised air generated by the EHD thruster 105.

The EHD thruster 105 may thus be used to provide forced convection for the heat sink 101, or radiator in order to effectively enhance natural convection cooling of the heat sink 101.

Figure 10:
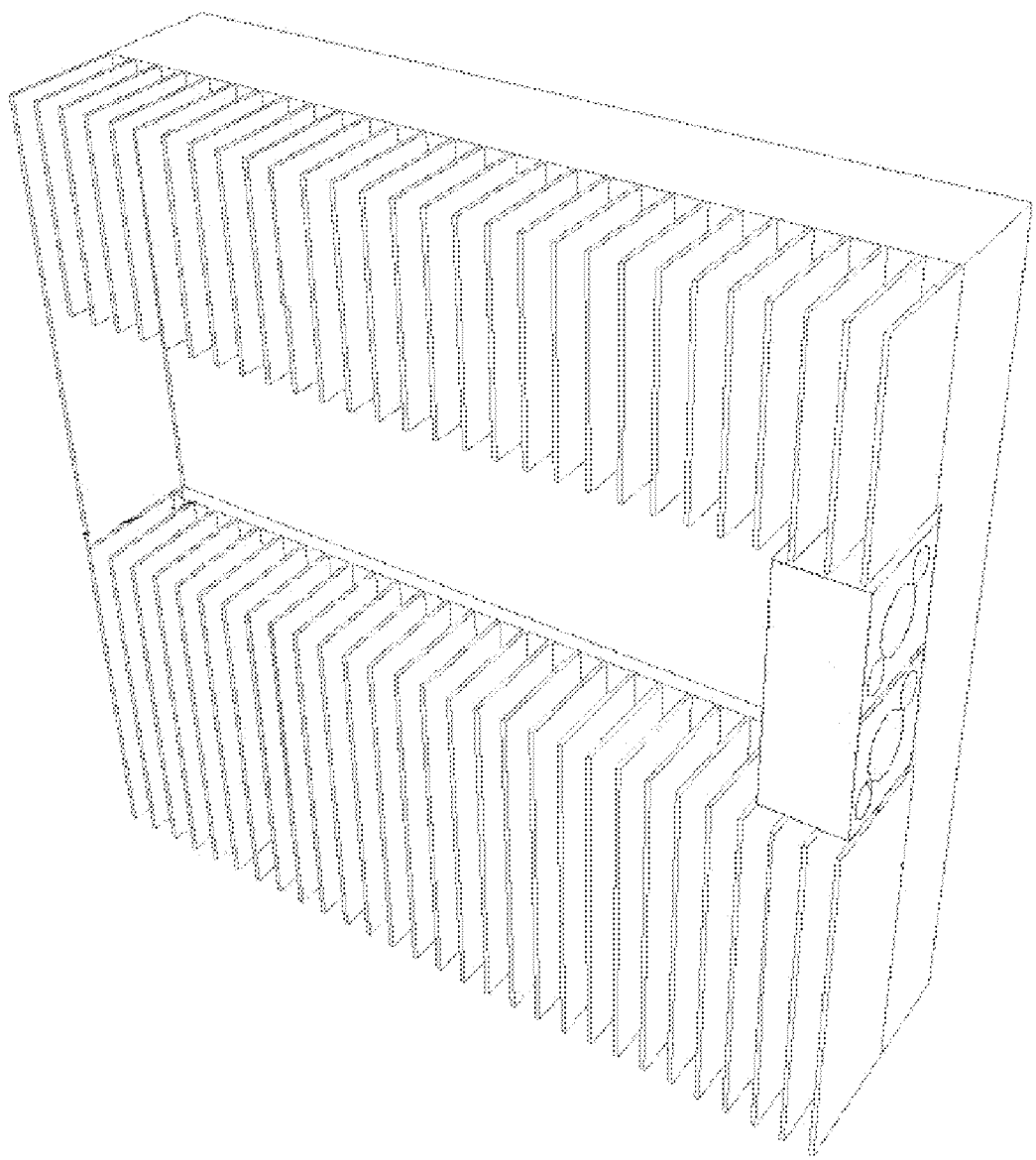
FIG. 10 illustrates a heat sink for fan forced convection cooling according to prior art.

The EHD thruster 105 may be integrated e.g. into the middle of the heat sink 101 in some embodiments. An advantage thereby comprises that the EHD thruster 105 and its electrodes are protected from unintentional short cut or touch by a human operator, which may cause an accident due to the usage of high voltage. Further, a compact design of the EHD thruster 105 is enabled and it may be possible to fit it into a prior art heat sink (as illustrated in FIG. 10), without requirements to change the appearance of heat sink shape and/or size.

The heat sink 101 may be electrically isolated from the EHD thruster 105. This may be an important issue for personal security reasons due to the usage of high voltage and also for reducing possible Electro Magnetic Compatibility (EMC) impact which otherwise may disturb for example transmitted radio signals when the heat sink 101 is arranged to cool a radio transmitting device such as an RRU.

Thereby, the EHD thruster 105 may be suitable for practical implementation of RRU cooling with no risk for sparking between a part of the EHD thruster 105 and the heat sink 101.

The presented integration of EHD cooling provides an improved cooling capacity of the heat sink 101 while not affecting the natural convection cooling when the EHD thruster 105 is deactivated. Thus EHD cooling by the EHD thruster 105 may be added when required, for example when the heat source 108 is overheated and/or e.g. during high radio traffic moments rendering high temperatures of an RRU in embodiments where the heat source 108 comprises an RRU. During low traffic, low temperature seasons, raining (which enhance cooling of the heat sink 101) windy conditions (which also enhance cooling of the heat sink 101), the EHD cooling of the EHD thruster 105 may be deactivated for saving energy. Thus the heat source 108 and/or the heat sink 101 may be cooled by natural convection cooling when enhanced cooling is not required.

The heat source 108 may comprise e.g. a RRU which may be a standalone entity, mounted on e.g. a pole or a wall, or mounted for example three RRU together. Placement of the EHD thruster 105 in the middle of the heat sink 101, or at least away from the edges of the heat sink 101, provide both push and pull airflow mode through the heat sink 101. The EHD thruster 105 may be oriented so that the generated ionic wind is blowing in the same direction as the natural convection cooling airflow directed, from a second region 107 of the heat sink 101, to a first region 106 of the heat sink 101, or from down to up when the RRU is operatively mounted for radio transmission.

As further illustrated in FIG. 1A, the EHD thruster unit 105 may in some embodiments be configured for providing an increased fresh pull airflow through the second region 107, or the down part of the RRU, which normally requires to keep low heat sink temperatures, due to the possible montage of sensible electronic equipment of for example the RRU, and meanwhile provide a push airflow throw the first region 106, or the upper part of the heat sink 101. The first region/upper part 106 of the heat sink 101 normally has a high heat sink temperature because of power amplifier parts cooling with biggest heat load to be dissipated. The EHD thruster 105 may also generate lower pressure directly beside a EHD fan tray and thanks thereto, more fresh/cold air sucks in to the EHD thruster 105 and participates in cooling both down part/second region 107 and upper heat sinks parts/first region 106.

Placement in the middle of the heat sink 101, makes it possible easily mount/dismount the EHD thruster 105 in and out of the heat sink 101. The heat sink 101 itself may be designed to be compatible to use either fan cooling based on traditional rotational fans, or cooling by ionic airflow by the EHD thruster unit 105.

The DC power supply unit 104 is a DC high voltage module. It may be an inner or outer unit, integrated with the EHD thruster 105 or not, i.e. comprising a separate unit, in different embodiments. As shown in FIG. 1A, the DC power supply unit 104 may comprise e.g. an outer power supplier and controller. The DC power supply unit 104 may provide the high voltage such as e.g. 5-10 kV to each anode electrodes to activate the EHD air flow. In some embodiments, the DC power supply unit 104 may be controlled by a control unit, for example by utilising a Pulse Width Modulation (PWM) control method based on heat source inner temperature situation, heat sink temperature or ambient temperature.

The temperature of the heat source 108 may be measured with one or more temperature sensors, or implicitly estimated, based on e.g. current radio traffic intensity (measured or estimated based on statistics), time of the year, time of the day, geographical location or a combination of these and/or additional factors.

Figure 1B:
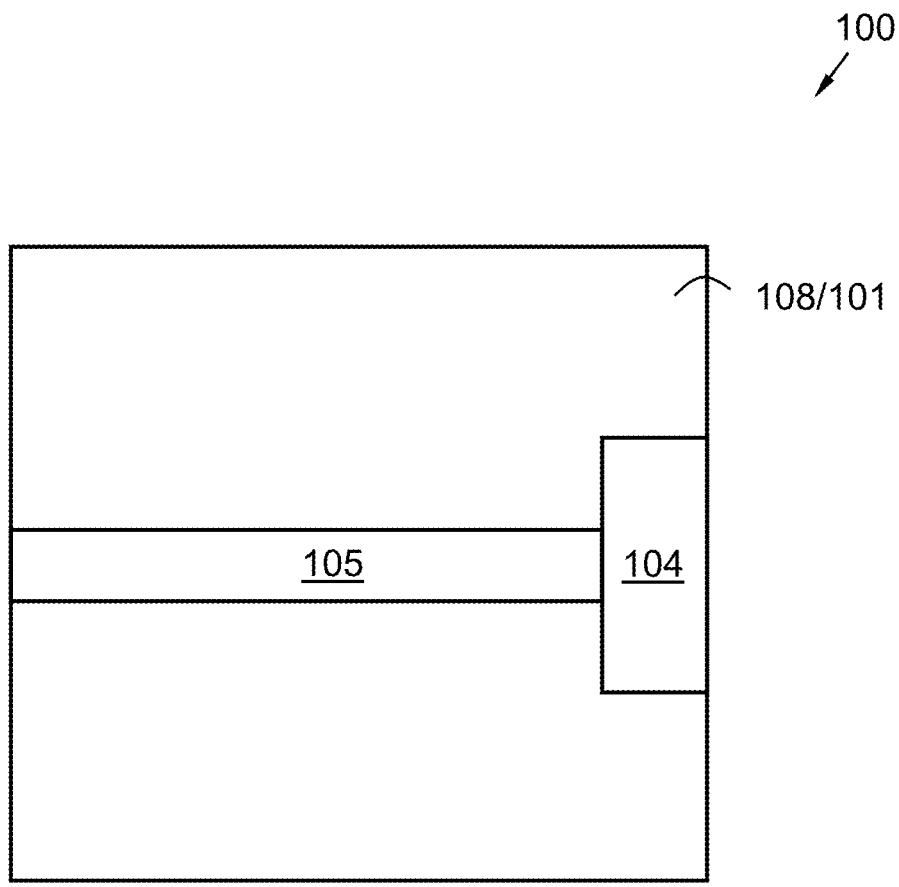
FIG. 1B is a block diagram illustrating a cooling system according to an embodiment.

The system 100 as illustrated in FIG. 1A is schematically illustrated from another perspective in FIG. 1B. The DC power supply unit 104 may in some embodiments be placed together with the EHD thruster 105, i.e. the EHD thruster frame, so as they together form one single unit. An advantage with this embodiment is that the EHD thruster 105 may be shaped in order to fit into a prior art heat sink, configured to keep a traditional rotating fan cooling, see FIG. 10. Thus the radio network owner may change e.g. an existing rotational fan cooling for the EHD thruster 105, without having to change the whole heat sink 101. Thereby resources (as the heat sink 101 per se probably has a lifetime exceeding the technical lifetime of the RRU) and work are saved.

Figure 8:
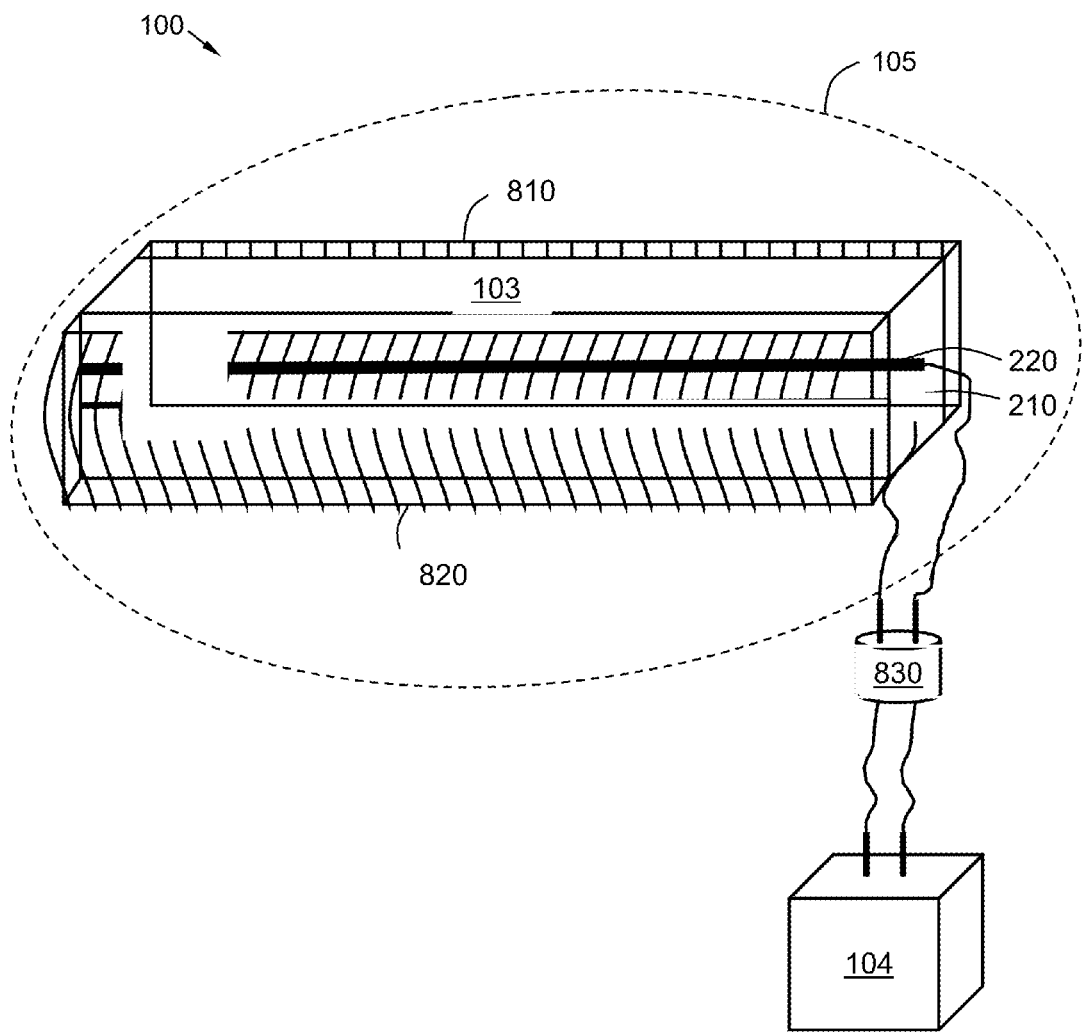
FIG. 8 illustrates an embodiment of a cooling system comprising an EHD thruster.

However, the DC power supply unit 104 may as well be situated in a separate unit, connected to the electrodes of the EHD thruster 105 as illustrated in FIG. 8.

The EHD thruster 105 may be implemented in various different designs, based on e.g. safety requirements, requirements for electromagnetic compatibility with e.g. radio equipment of the heat source 108 when comprising a telecommunication device, achieved effect of the EHD thruster 105 and manufacturing factors. Subsequently, some non-limiting examples of such implementations of the EHD thruster 105 and the cooling system 100 will be presented.

Thus FIGS. 2A-5C and also FIG. 8 illustrates some different embodiments of the EHD thruster 105 having e.g. different type of electrodes (i.e. anodes/cathodes, respectively), different distances between electrodes, different numbers of electrodes, different placing of the electrodes in relation to each other, different polarity of the electrodes and different levels of high voltage DC power supply for achieving max airflow, or at least sufficiently high airflow at minimal or at least somewhat lower power consumption and voltage level.

Figure 2A:
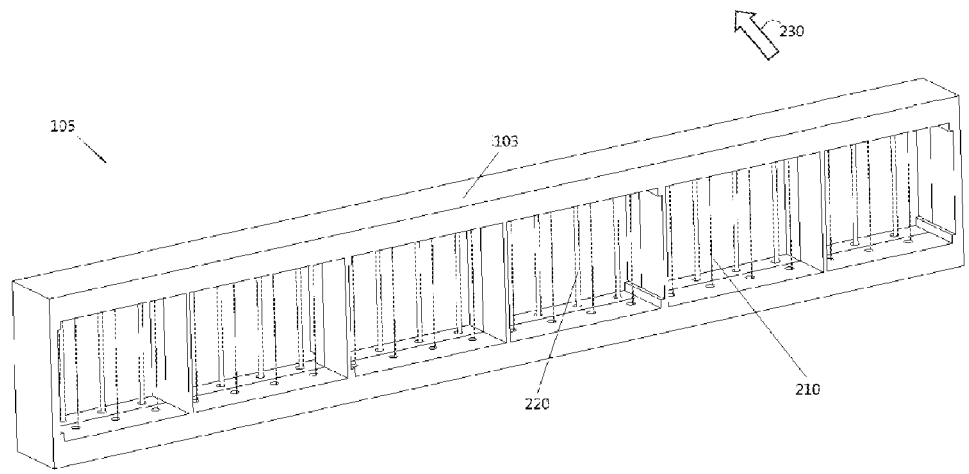
FIG. 2A is a block diagram illustrating an EHD thruster according to a first embodiment.
Figure 2B:
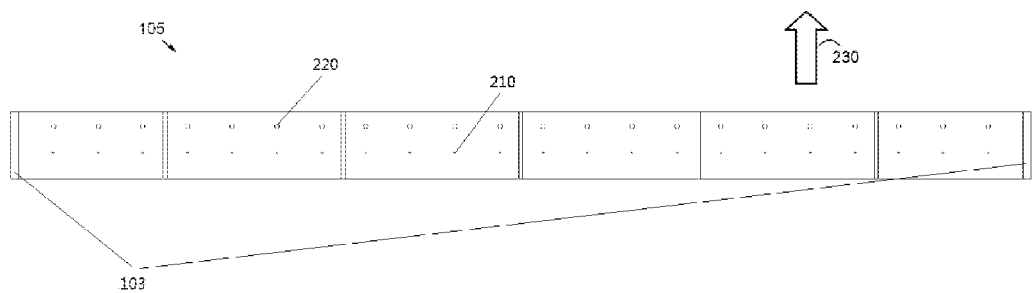
FIG. 2B is a block diagram illustrating an EHD thruster according to the first embodiment.
Figure 2C:
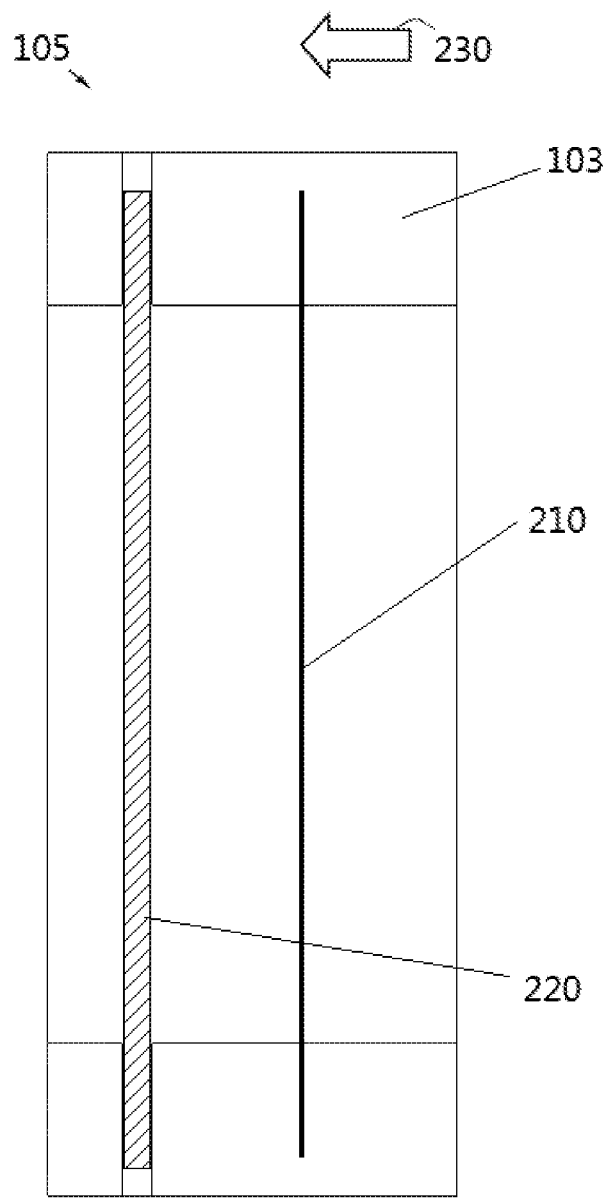
FIG. 2C is a block diagram illustrating an EHD thruster according to the first embodiment.

FIG. 2A depicts an example of an embodiment of the EHD thruster 105. FIG. 2B and FIG. 2C are cross-sectional views corresponding to the embodiment illustrated in FIG. 2A. In this concept, a first set of electrodes 210, or ionisers, and a second set of electrodes 220, sometimes referred to as collectors, are comprised in a supportive structure 103 of the EHD thruster 105. The supportive structure 103 may be fabricated from dielectric material(s) such as e.g. plastic to provide electrical isolation from other components of the EHD thruster 105 in some embodiments. The EHD thruster 105, when fed with high voltage DC power such as some kV e.g. 5-10 kV, generates an ionic airflow in a direction 230.

As shown in FIG. 2B, the two sets of electrodes 210, 220 may have a round cross sectional shape in this non limiting embodiment. The first set of electrodes 210, or ionisers, may have smaller radii of curvature than the second set of electrodes 220 and may take the form of wires or rods. Further, the respective sets of electrodes 210, 220 may comprise one single electrode, or a plurality of electrodes, which in this embodiment may be arranged in parallel with each other, as illustrated in FIG. 2C, showing a cross-sectional view of the supportive structure 103 of the EHD thruster 105.

Each of the first set of electrodes 210, i.e. ionisers, and the second set of electrodes 220 may be coupled either directly or indirectly, to the high voltage DC power supply unit 104 to establish an electrical potential (DC voltage) between the first set of electrodes 210 and the second set of electrodes 220. The first set of electrodes 210, i.e. ionisers, and the second set of electrodes 220 are electronically isolated except for the flow of ions through the air in an airflow direction 230, as illustrated in the FIGS. 2A-5C.

The ions may comprise positive, or alternatively negative ions depending upon whether the first set of electrodes 210, i.e. ionisers are coupled to the positive or negative terminal of the DC power supply unit 104. The first set of electrodes 210 may in some embodiments be coupled to the negative terminal of the DC power supply unit 104 while the second set of electrodes 220 may be coupled to the positive terminal of the DC power supply unit 104, or to the ground. In other embodiments, the first set of electrodes 210 may alternatively be coupled to the positive terminal of the DC power supply unit 104 while the second set of electrodes 220 may be coupled to the negative terminal of the DC power supply unit 104, or to the ground.

The high voltage DC power supply unit 104 may provide e.g. 5-10 kV.

The first set of electrodes 210 and/or the second set of electrodes 220 may be made of electrically conductive material such as tungsten, copper, stainless steel or other, such as e.g. an alloy comprising any or some of these materials. Further, according to some embodiments, the electrodes comprised in the first set of electrodes 210 and/or the second set of electrodes 220 may comprise a bar of dielectric material such as plastic, covered by a metalized surface.

Neither the first set of electrodes 210 nor the second set of electrodes 220 may be limited to a round shape, as will become more apparent from the subsequent embodiment descriptions below.

Furthermore, in the illustrated embodiment, the first set of electrodes 210 may comprise multiple parallel electrodes while the second set of electrodes 220 may comprise multiple parallel electrodes. The first set of electrodes 210 may be arranged in parallel with the second set of electrodes 220.

Figure 3A:
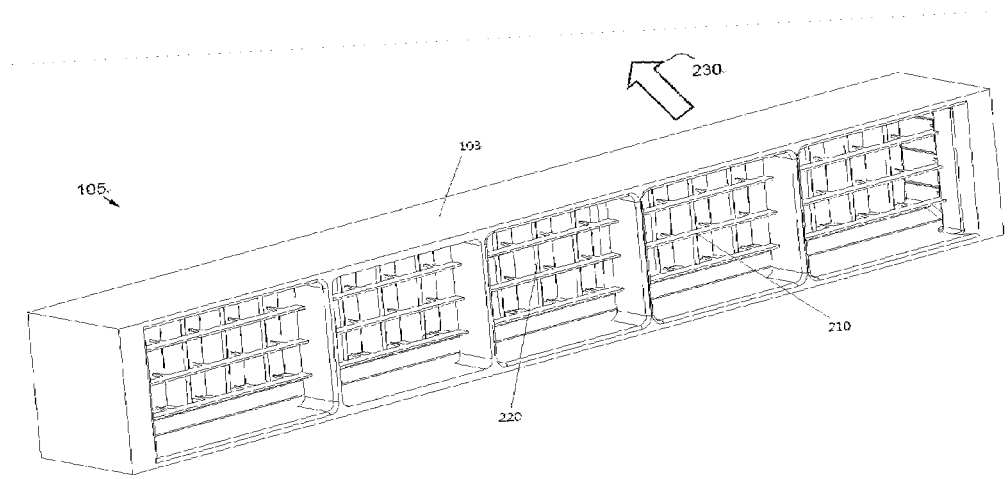
FIG. 3A is a block diagram illustrating an EHD thruster according to a second embodiment.
Figure 3B:
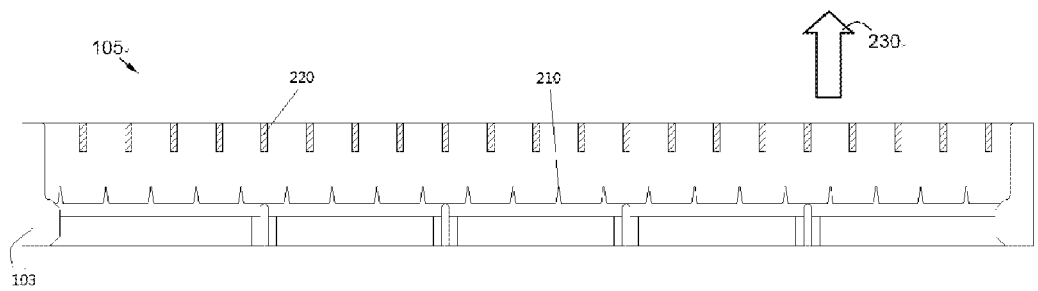
FIG. 3B is a block diagram illustrating an EHD thruster according to the second embodiment.
Figure 3C:
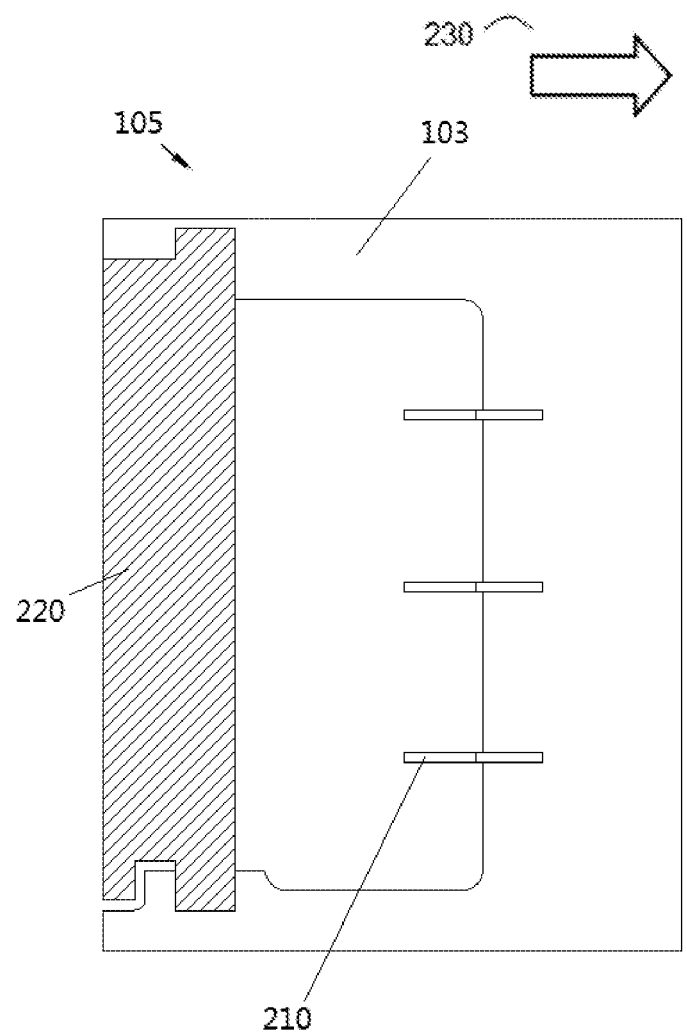
FIG. 3C is a block diagram illustrating an EHD thruster according to the second embodiment.

FIG. 3A illustrates another example of an embodiment of the EHD thruster 105. FIG. 3B and FIG. 3C are cross-sectional views corresponding to the embodiment illustrated in FIG. 3A. In this concept, a first set of electrodes 210, or ionisers, and a second set of electrodes 220, sometimes referred to as collectors, are comprised in the supportive structure 103 of the EHD thruster 105. The supportive structure 103 may be fabricated from dielectric material(s) such as e.g. plastic to provide electrical isolation from other components of the EHD thruster 105.

In this embodiment, the first set of electrodes 210 and the second set of electrodes 220 comprise multiple electrodes each, supported by the supportive frame 103 fabricated from dielectric material(s) to provide electrical isolation from other components of the EHD thruster 105. The EHD thruster 105 creates an air flow in a direction 230.

As may be seen in FIG. 3B, the first set of electrodes 210 may comprise line electrodes with needle-like extrusions on the edge. The ionising of air may occur between the tip of the needle-like patterns of the first set of electrodes 210 and the second set of electrodes 220 when DC high voltage is applied to the respective electrodes 210, 220.

The second set of electrodes 220 may comprise bar electrodes and each such electrode may have a rectangular cross-sectional shape. However, other embodiments may comprise other geometries which may be designed based on a variety of factors.

In some embodiments, the second set of electrodes 220 may be made of an electrically conductive material such as tungsten, copper, stainless steel or other similar material, or an alloy comprising e.g. any or some of these or other materials and may further comprise a patterned conductor on a dielectric material.

The at least one needle-like extrusion of the first set of electrodes 210 may be displaced with regard to the second set of electrodes 220, in the direction 230 of the created airflow, as may be seen in FIG. 3B.

Figure 4A:
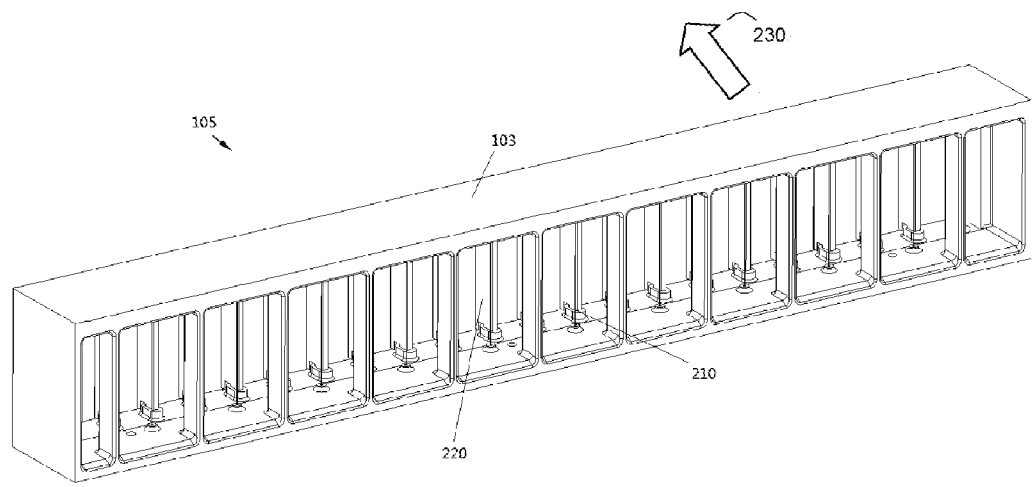
FIG. 4A is a block diagram illustrating an EHD thruster according to a third embodiment.
Figure 4B:
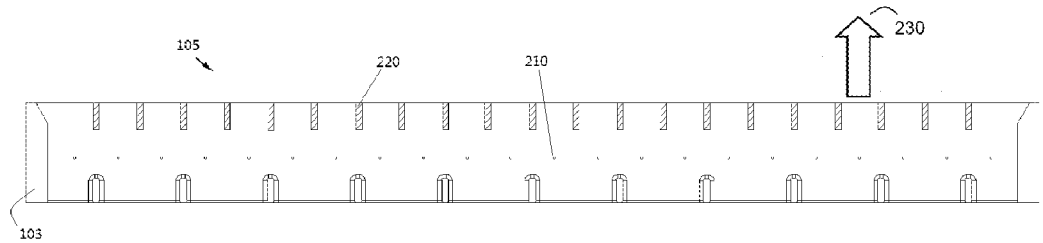
FIG. 4B is a block diagram illustrating an EHD thruster according to the third embodiment.
Figure 4C:
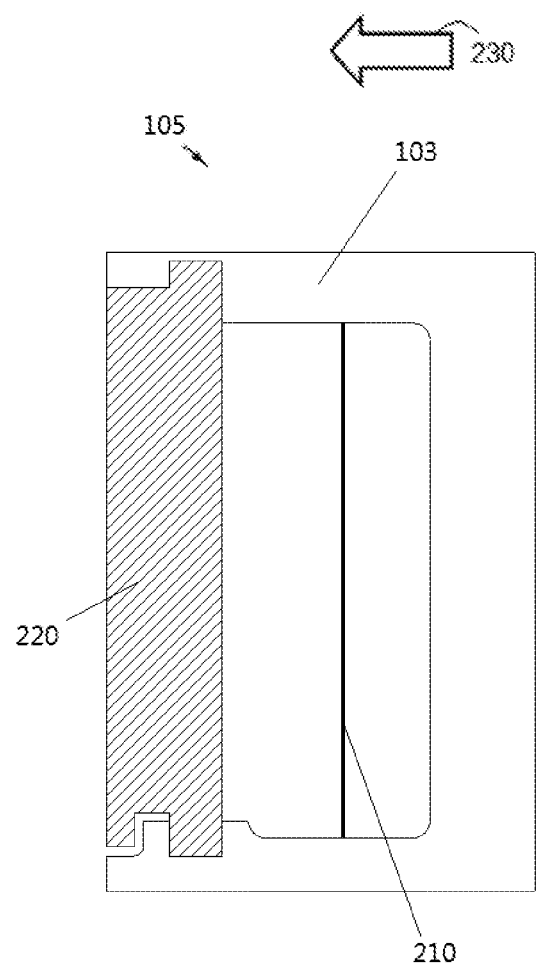
FIG. 4C is a block diagram illustrating an EHD thruster according to the third embodiment.

FIG. 4A is an illustration of yet an embodiment of the configuration of an EHD thruster concept which for example may be integrated to a heat sink 101 in some embodiments. FIG. 4B and FIG. 4C are cross-sectional views corresponding to the EHD thruster 105, illustrated in FIG. 4A.

In this illustrated embodiment, the EHD thruster 105 comprises the first set of electrodes 210, or ioniser, and the second set of electrodes 220 embraced by the supportive frame 103. In this illustrated configuration, the first set of electrodes 210 may be arranged similarly as in the embodiment illustrated in FIG. 2A-C, while the second set of electrodes 220 may be arranged similarly as in the embodiment illustrated in FIG. 3A-C.

Thus, in the illustrated embodiment, the first set of electrodes 210 may comprise multiple parallel electrodes while the second set of electrodes 220 may comprise multiple parallel electrodes. The first set of electrodes 210 may be arranged in non-parallel with the second set of electrodes 220. The EHD thruster 105 creates airflow in the direction 230.

Figure 5A:
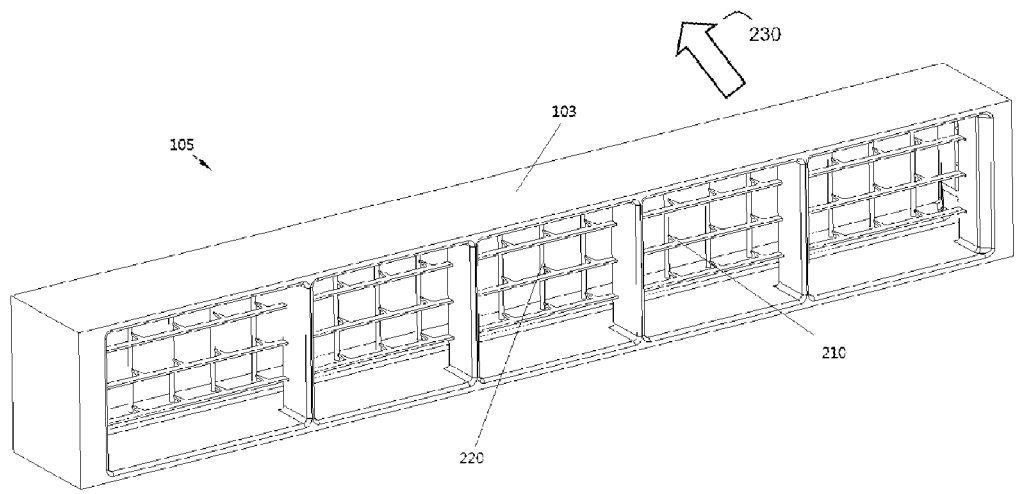
FIG. 5A is a block diagram illustrating an EHD thruster according to a fourth embodiment.
Figure 5B:
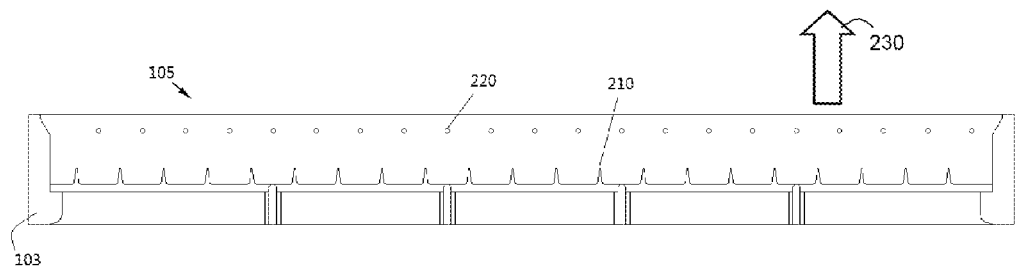
FIG. 5B is a block diagram illustrating an EHD thruster according to the fourth embodiment.
Figure 5C:
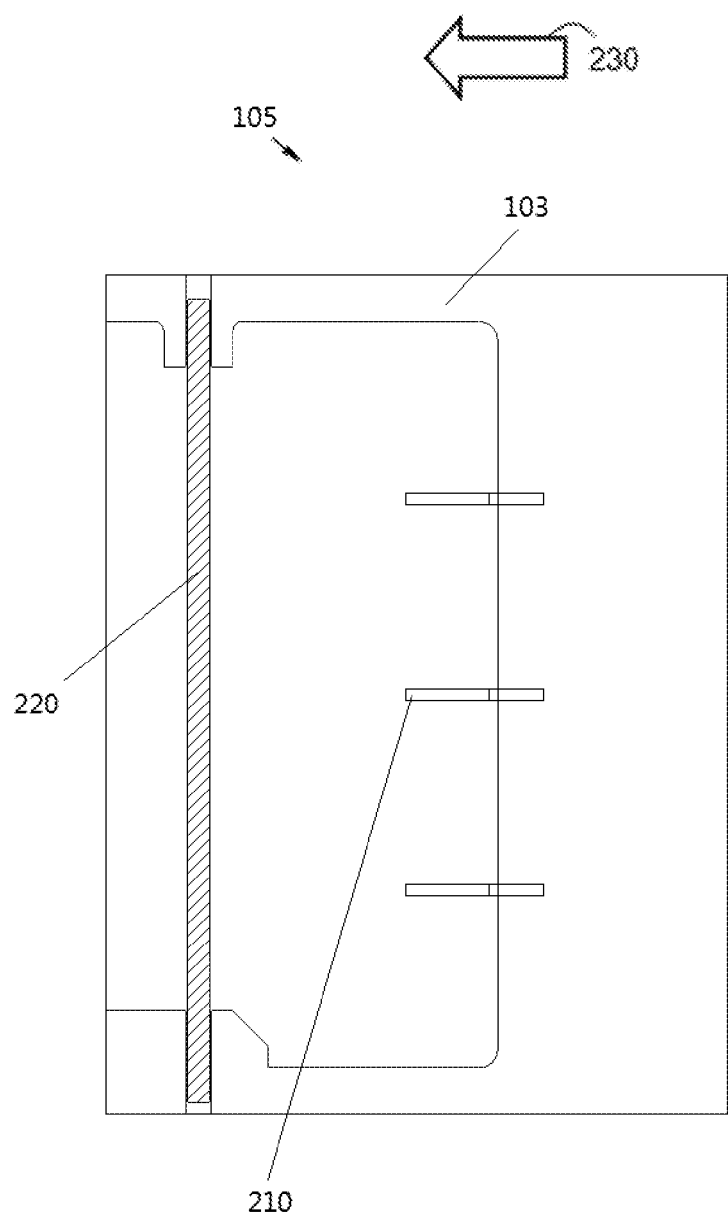
FIG. 5C is a block diagram illustrating an EHD thruster according to the fourth embodiment.

FIG. 5A illustrates another embodiment of the EHD thrusters 105 which for example may be integrated into e.g. electronic equipment such as e.g. a RRU. FIG. 5B and FIG. 5C are cross-sectional views corresponding to the EHD thruster 105, illustrated in FIG. 5A.

In this embodiment, the EHD thruster 105 comprises a first set of electrodes 210, or ionisers, and a second set of electrodes 220, and a dielectric frame structure 103. The first set of electrodes 210 may be similar to, or identical with, the first set of electrodes 210 described in conjunction with the presentation of FIG. 3A-3C. Further, the second set of electrodes 220 may be similar to, or identical with, the second set of electrodes 220 described in conjunction with the presentation of FIG. 2A-2C.

The first set of electrodes 210 thus may comprise needle-like extrusions and or pattern on the edge of the comprised electrodes is designed as horizontal, comprising at least one row of electrodes. Any supporting non-metallic parts of the supportive structure 103 may be placed beside the needle-like extrusions of the first set of electrodes 210. The EHD thruster 105 creates airflow in a direction 230.

The first set of electrodes 210 and/or the second set of electrodes 220 may in some embodiments comprise one or more electrodes which are made of a bar made of metal, or made of dielectric material such as e.g. plastic or similar, which is metalized in some embodiments. The second set of electrodes 220 may be placed on an appropriate distance from the needle-like extrusions on the edge of electrodes comprised in the first set of electrodes 210, which distance may be depending on the applied DC High Voltage level provided by the high voltage DC power supply unit 104. Such appropriate distance may be e.g. a few millimeters, or a few centimeters in different embodiments.

The distance between the first set of electrodes 210 and/or the second set of electrodes 220 respectively and the heat sink 101 may be at least one millimeter to ensure the non electrical connection between the respective set of electrodes 210, 220 and the grounded heat sink 101.

In some embodiments, negative voltages may be connected to the first set of electrodes 210, or ionisers, while positive voltages or ground may be connected to the second set of electrodes 220. The heat sink 101 may be electrically isolated from the EHD thruster 105 in some embodiments. Further, the heat sink 101 may be grounded in some embodiments.

The EHD thruster 105 may increase the convection capacity of the heat sink 101 up to for example 40 W/L, according to some embodiments. Thereby the disclosed EHD thruster 105 may enable an intensified usage of the heat source 108 such as e.g. radio equipment to be cooled, while keeping the design of the cooling system 100 compact. Further, in some embodiments when the radio capacity of the RRU is not utilized at its maximum potential (e.g. at night time), when the ambient temperature is low, i.e. below a predetermined threshold temperature or otherwise when the utilization or temperature of the heat source 108, or RRU, the EHD thruster 105 may be switched off and the heat sink 101 may be cooled only by natural convection cooling. Thereby, energy is saved over time.

Another advantage of the disclosed EHD thruster 105 comprises increased reliability in comparison with traditional fan cooling solutions, because the EHD thruster 105 does not comprise any rotating or moving part. Thereby service and maintenance costs may be kept low, or even be completely omitted. Also, the risk of overheating of the heat source 108 due to rotating fan/bearing failure is omitted, as there are no rotating or moving mechanical parts in the EHD thruster 105.

The EHD thruster 105 is a silent system, free from vibrations, which minimizes the sound disturbance and energy loss.

Further, as the disclosed solution is based on using EHD thruster enhanced cooling when required, e.g. during peak hours and otherwise utilize natural convection cooling, energy is saved in comparison with prior art fan enhanced cooling, which require constant operation.

In addition the EHD thruster 105 is compact and may be adjusted and/or integrated to an application of any size.

Further, the EHD thruster 105 is designed for operation during different humidity levels, comprising e.g. a humidity level of about 15-99% and moderate rain, without showing any unstable operations, sparking or short-cuts.

During heavy rain, in particular in combination with low temperature, the heat sink 101 will be additionally cooled by the rain/water, why the EHD thruster 105 probably may be disabled during such conditions.

Figure 6:
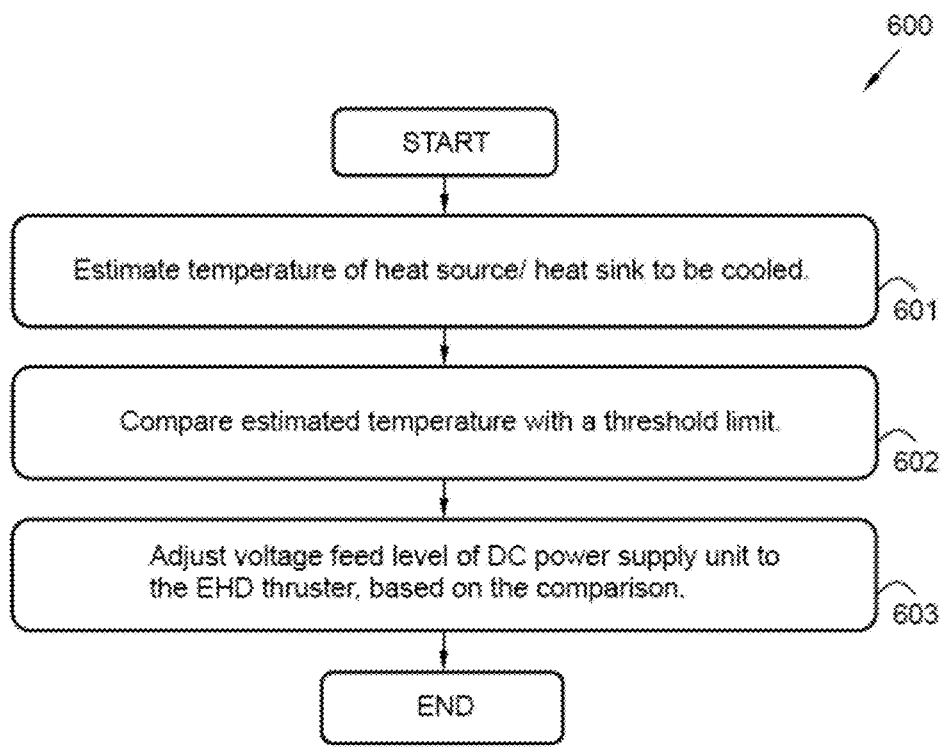
FIG. 6 is a flow chart illustrating a method according to an embodiment.

FIG. 6 is a flow chart illustrating embodiments of a method 600 in a control unit for controlling airflow generation of an EHD thruster 105. The EHD thruster 105 comprises a first set of electrodes 210, a second set of electrodes 220, and a supporting structure 103 for supporting the first set of electrodes 210 and the second set of electrodes 220. The EHD thruster 105 is configured for generating airflow of ionised air for cooling a heat sink 101 which may be thermally connected to a heat source 108. The EHD thruster 105 is electrically isolated from the heat sink 101. The heat sink 101 may be grounded in some embodiments.

The EHD thruster 105 may be configured to generate a push airflow in a first direction 230 through a first part 106 of the heat sink 101 and a pull airflow through a second part 107 of the heat sink 101. In some embodiments, this is enabled by the EHD thruster 105, placed between the first part 106 and the second part 107 of the heat sink 101, by decreasing the local air pressure resulting in a cold airstream through the heat sink 101.

The EHD thruster 105 may be configured to generate the airflow when a DC power supply unit 104 provides a DC current to the first and/or second sets of electrodes 210, 220.

The cooling airflow of the EHD thruster 105 may in some embodiments be adjustable by adjusting DC voltage feed, based on an estimation of the temperature of a heat source 108 thermally connected to the heat sink 101. Such estimation may be made by one or more temperature sensors, or by an estimation of the temperature based on e.g. historical/statistical temperature.

The heat source 108 may comprise e.g. electronic equipment, or radio transmitting equipment such as a RRU, configured for transmitting radio signals according to any arbitrary radio access technology such as, e.g., 3GPP LTE, LTE-Advanced, Evolved Universal Terrestrial Radio Access Network (E-UTRAN), etc. The RRU may in turn form part of a Base Transceiver Station such as an evolved NodeB (eNodeB) according to some embodiments.

To appropriately control the airflow generation of the EHD thruster 105, the method 600 may comprise a number of actions 601-603. It is however to be noted that any, some or all of the described actions 601-603, may be performed in a somewhat different chronological order than the enumeration indicates, or be performed simultaneously. Further, it is to be noted that some actions may be performed in a plurality of alternative manners according to different embodiments. The method 600 may comprise the following actions:

Action 601

The temperature of the heat source 108, thermally connected to the heat sink 101 to be cooled heat sink 101 is estimated.

The estimation of temperature may be made e.g. by measuring the temperature with one or several temperature sensors, applied at the heat source 108, heat sink 101 and/or the proximity of the heat sink 101. However, the estimation of temperature may be based on one or more of: radio traffic intensity (which may be measured or estimated based on statistics), time of the day, time of the year, outside temperature, geographical location, wind, or similar conditions.

Action 602

The estimated 601 temperature of the heat sink 101 and/or the heat source to be cooled is compared with a threshold limit. The threshold limit may be predetermined or configurable according to different embodiments.

In some embodiments, the voltage feed level of the DC power supply unit 104 may be variable and the comparison may be made against a set of threshold limit intervals, wherein each such threshold limit interval is associated with a voltage level of the DC power supply unit 104, comprising e.g. 0 V.

Action 603

The voltage feed level of the DC power supply unit 104 to the first and second sets of electrodes 210, 220 is adjusted, based on the made comparison 602.

Thereby, the voltage feed of the DC power supply unit 104 may be turned on, or increased (in case it is already turned on) when the estimated 601 temperature of the heat sink 101 and/or the heat source exceeds the threshold limit and/or switched off, or possibly decreased when the estimated 601 temperature of the heat sink 101 and/or the heat source 108 is lower than the threshold limit.

The adjustment of the voltage feed level may comprise, or be based on generation and transmission of pulse width modulation signals in a control unit. Such pulse width modulation signals may then be transmitted to the DC power supply unit 104, triggering the DC power supply unit 104 to turn on, switch off, increase and/or decrease the voltage feed.

By adjusting the voltage feed level of the EHD thruster 105, the airflow generation of the EHD thruster 105 may be increased, by increasing the DC voltage feed level, or alternatively decreased or even omitted by decreasing the DC voltage feed level or omit voltage feed. Thereby a flexible and adaptive configuration of the EHD thruster 105 is achieved. Also, energy may be saved when no forced cooling is required.

Figure 7:
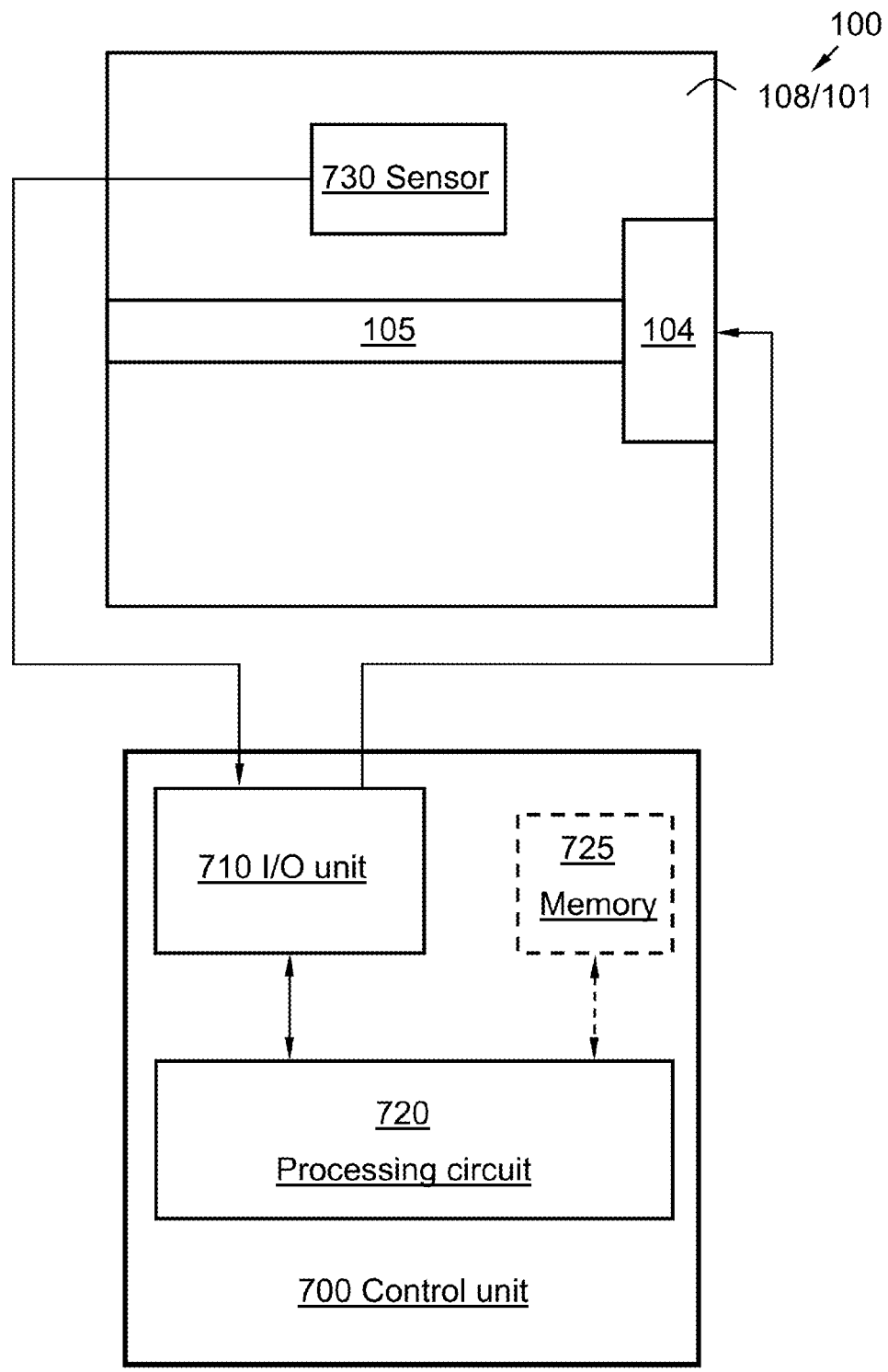
FIG. 7 illustrates an embodiment of a cooling system and a control unit.

FIG. 7 is illustrating the cooling system 100 comprising the Electro Hydro Dynamic (EHD) thruster 105 and the heat sink 101. Further, FIG. 7 schematically illustrates a control unit 700, configured for estimating temperature of the heat source 108 to be cooled and adjusting the voltage feed level of the DC power supply unit 104, based on a comparison between the estimated temperature of the heat source 108 and a threshold limit.

For enhanced clarity, any internal electronics or other components of the control unit 700 and the system 100, not entirely essential for understanding the herein described embodiments have been omitted from FIG. 7.

The EHD thruster 105 is configured for generating airflow of ionised air for cooling the heat sink 101 which may be thermally connected to the heat source 108, when the DC power supply unit 104 provides a DC current to the first and second sets of electrodes 210, 220. Also, the EHD thruster 105 is electrically isolated from the heat sink 101.

According to some embodiments, the EHD thruster 105 may be configured to generate a push airflow in a first direction 230 through a first part 106 of the heat sink 101 and a pull airflow through a second part 107 of the heat sink 101.

The cooling airflow of the EHD thruster 105 may be adjustable by the DC power supply unit 104 feeding, based on an estimation of the temperature of the heat source to be cooled in some embodiments. Thus the cooling airflow of the EHD thruster 105 may be adjustable by adjusting DC voltage feed, based on an estimation of the temperature of the heat source 108 thermally connected to the heat sink 101 in some embodiments.

In some embodiments, the first set of electrodes 210 may comprise one electrode or multiple parallel electrodes and the second set of electrodes 220 may comprise one electrode or multiple parallel electrodes. The first set of electrodes 210 may be arranged in parallel, or perpendicular to the second set of electrodes 220.

Further, any electrode comprised within the first set of electrodes 210, or the second set of electrodes 220 may be made of metal or dielectric material covered by a metalized surface in different embodiments.

Furthermore, the first set of electrodes 210, or the second set of electrodes 220 may comprise at least one line electrode in some embodiments.

In some embodiments, the second set of electrodes 220 may comprise at least one line electrode arranged in parallel with the first set of electrodes 210. In some embodiments, the second set of electrodes 220 may comprise at least one bar electrode arranged in parallel with the first set of electrodes 210.

The first set of electrodes 210 may comprise at least one electrode with at least one needle-like extrusion on an edge of the electrode, directing towards the second set of electrodes 220 in some embodiments. The at least one needle-like extrusion of said at least one electrode in the first set of electrodes 210 may further be displaced with regard to the second set of electrodes 220, in the first direction 230 of the created push airflow in some embodiments.

The second set of electrodes 220 may alternatively comprise at least one bar electrode arranged perpendicular to the first set of electrodes 210. However, in some embodiments the second set of electrodes 220 may comprise at least one line electrode arranged perpendicular to the first set of electrodes 210.

The supporting structure 103 comprised within the EHD thruster 105 may be open in the first direction 230 towards the first part 106 of the heat sink 101 and may be open in a second direction towards the second part 107 of the heat sink 101, for enabling natural convection cooling of the heat sink 101 when the EHD thruster 105 is switched off In further addition, the first set of electrodes 210 may be connected to negative voltage and the second set of electrodes 220 may be connected to either positive voltage or ground. Alternatively, in some embodiments, the first set of electrodes 210 may be connected to positive voltage and the second set of electrodes 220 may be connected to either negative voltage or ground.

In alternative embodiments, the second set of electrodes 220 may be electrically grounded and comprised in the heat sink 101. Thus the second set of electrodes 220 may be comprised within the heat sink 101.

Further, the supporting structure 103 may be electrically isolated from the first and second sets of electrodes 210, 220 and may further be metalized for protecting nearby electronic equipment from electromagnetic interference.

Also, the supporting structure may comprise at least one grid for enclosing the first set of electrodes 210 and/or the second set of electrodes 220 while enabling natural convection cooling of the heat sink 101 by allowing airflow through the supporting structure 103.

The control unit 700 may comprise an I/O circuit 710, configured for collecting measurement data from one or more sensors 730, e.g. temperature sensors comprised within the heat sink 101, the heat source 108, and/or the ambient. The I/O circuit 710 may also provide instructions to the DC power supply unit 104 for adjusting the DC voltage level provided by the DC power supply unit 104 to the EHD thruster 105.

Furthermore, the control unit 700 may comprise a processing circuit 720. The processing circuit 720 is configured to estimate temperature of the heat source 108 and/or the heat sink 101 to be cooled. Further, the processing circuit 720 is configured to compare the estimated temperature with a threshold limit. In addition, the processing circuit 720 is configured to adjust the voltage feed level of the DC power supply unit 104 to the first and second sets of electrodes 210, 220 based on the comparison.

The processing circuit 720 may comprise, e.g., one or more instances of a Central Processing Unit (CPU), a processing circuit, a processor, an Application Specific Integrated Circuit (ASIC), a microprocessor, or other processing logic that may interpret and execute instructions. The herein utilised expression "processing circuit" may thus represent a processing circuitry comprising a plurality of processing circuits, such as, e.g., any, some or all of the ones enumerated above.

The processing circuit 720 may further perform data processing functions for inputting, outputting, and processing of data comprising data buffering and device control functions, such as call processing control, user interface control, or the like.

Furthermore, control unit 700 may comprise at least one memory 725, according to some embodiments. The memory 725 may comprise a physical device utilised to store data or programs, i.e., sequences of instructions, on a temporary or permanent basis. According to some embodiments, the memory 725 may comprise integrated circuits comprising silicon-based transistors. Further, the memory 725 may be volatile or non-volatile.

The previously described actions 601-603 to be performed by the control unit 700 may be implemented through the one or more processing circuits 720 therein, together with computer program code for performing the functions of the actions 601-603. Thus a computer program product, comprising instructions for performing the actions 601-603 in the control unit 700, for controlling airflow generation of the EHD thruster 105, when the computer program product is loaded in a processing circuit 720 of the control unit 700. Thus a computer program and a computer program product may comprise a program code for performing a method 600 according to any of the described actions 601-603, when the computer program runs on a computer.

The computer program product mentioned above may be provided for instance in the form of a data carrier carrying computer program code for performing any, at least some, or all of the actions 601-603 according to some embodiments when being loaded into the processing circuit 720. The data carrier may be, e.g., a hard disk, a CD ROM disc, a memory stick, an optical storage device, a magnetic storage device or any other appropriate medium such as a disk or tape that may hold machine readable data in a non transitory manner. The computer program product may furthermore be provided as computer program code on a server and downloaded to the control unit 700 remotely, e.g., over an Internet or an intranet connection.

FIG. 8 illustrates an embodiment of the cooling system 100. The illustrated embodiment comprises the EHD thruster 105, configured for generating airflow of ionised air and a heat sink 101. The EHD thruster 105 is electrically isolated from the heat sink 101. A heat source 108 to be cooled may be thermally connected to the heat sink 101.

The heat sink 101 may comprise a first part 106 and a second part 107, which heat sink 101 may be electrically grounded. The heat sink 101 may in some embodiments comprise a compartment for holding the EHD thruster 105 according to any of the previously described embodiments, for providing a push airflow in a first direction 230 through the first part 106 of the heat sink 101 and a pull airflow through the second part 107 of the heat sink 101.

In addition, the system 100 may comprise a DC power supply unit 104, configured for providing a DC current to the first and second sets of electrodes 210, 220 of the EHD thruster 105.

Also, the DC power supply unit 104 may be configured to convert from low voltage DC input to a variable high voltage DC output, where the level of high voltage DC output may be controlled by the control unit 700, which in some embodiments may be comprised in a radio resource unit (RRU) or similar.

The system 100 also comprises a heat sink 101 as stated before, wherein the EHD thruster 105 is electrically isolated from the heat sink 101. The heat sink 101 is not illustrated in FIG. 8, for enhancing clarification. Such heat sink 101 may be electrically grounded and comprise a compartment for holding an EHD thruster 105 for providing a push airflow through a first part 106 of the heat sink 101 and a pull airflow through a second part 107 of the heat sink 101.

The system 100 may in some alternative embodiments comprise a short cut detector 830. Thus in some embodiments, the DC power supply unit 104 may be configured to disable the voltage feed when a short cut behaviour is detected and to enable the voltage feed of the DC power supply unit 104 when no short cut is detected by the short cut detector 830.

The EHD thruster 105 comprises a supporting structure 103 which may be electrically isolated from the first and second sets of electrodes 210, 220 and may in some embodiments be metalized for protecting nearby electronic equipment from electromagnetic interference.

Furthermore, the supporting structure 103 may comprise a first and a second protective grid 810, 820 enclosing the first set of electrodes 210 and the second set of electrodes 220 while supporting natural convection cooling of the heat sink 101 by enabling airflow through the supporting structure 103. The first and second protective grids 810, 820 may have the form of a grid, one or more horizontal and/or vertical bars, or e.g. a framework of spaced bars that are parallel to or cross each other in different embodiments. The first and second protective grids 810, 820 may protect the first and second sets of electrodes 210, 220 from insects, dirt and also fingers of a service technician or the like, while not blocking the EHD thruster 105 from natural convection cooling.

In some embodiments, the described cooling system 100 and EHD thruster 105 may be utilised for cooling a RRU of a base station site, or a heat sink 101 of an RRU. Further the EHD thruster 105 may be configured to fit into a prior art RRU heat sink, see FIG. 10. Further, the EHD thruster 105 may be unconnected and/or electrically neutral to the RRU in some embodiments. Such RRU might be grounded. Thereby, the EHD thruster 105 becomes a safer and also an Electro-Magnetic Compatibility (EMC) neutral unit. The heat sink 101 may be painted in some embodiments. Thereby corrosion of the heat sink 101, which over time may cause short cut may be omitted, or at least delayed in time, possibly beyond the operative lifetime of the RRU.

Figure 9:
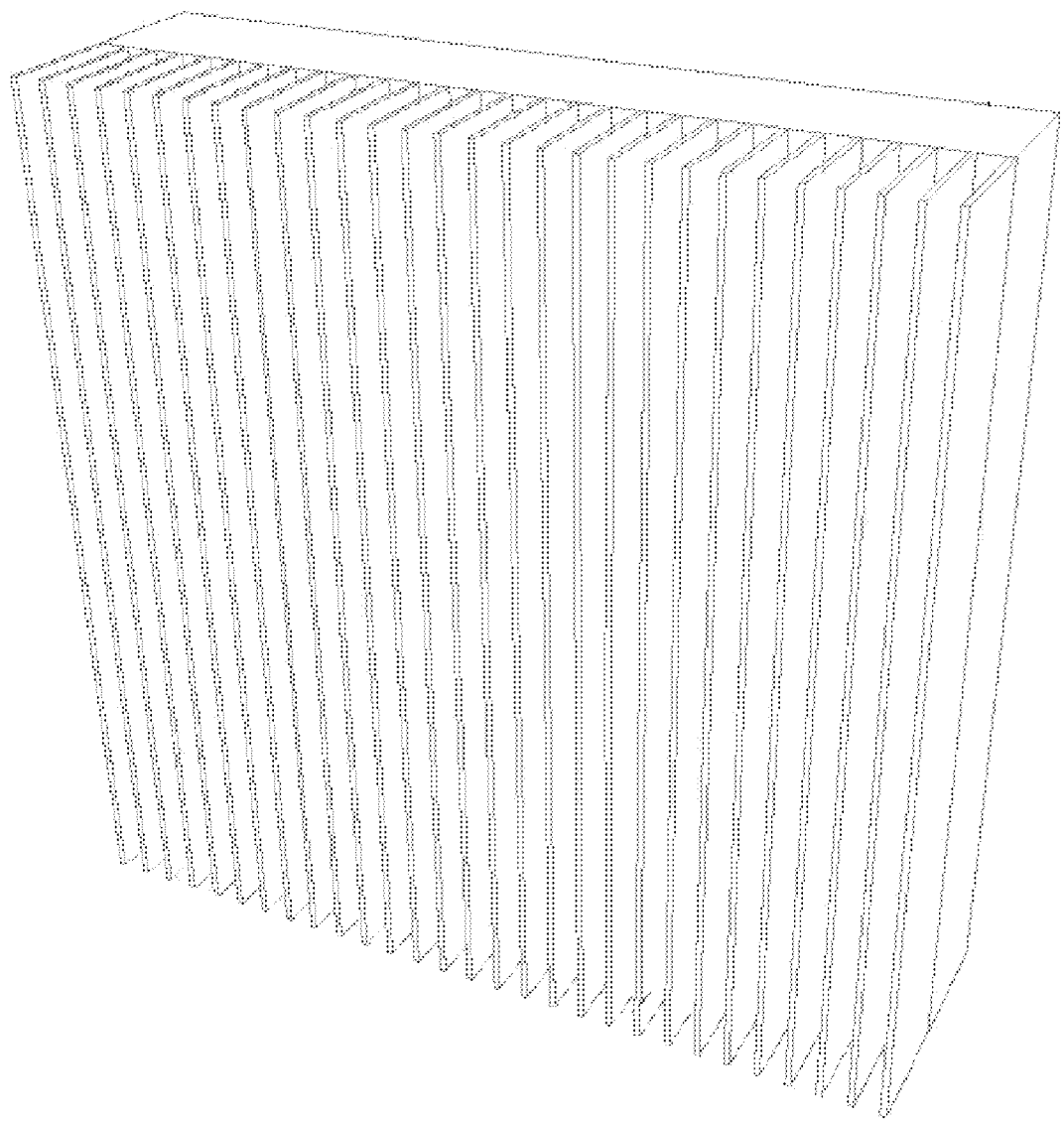
FIG. 9 illustrates a heat sink for natural convection cooling according to prior art.

FIG. 9 illustrates a heat sink of an RRU, configured for natural convection cooling according to prior art.

FIG. 10 illustrates a heat sink of an RRU, configured for fan cooling according to prior art.

The terminology used in the detailed description of the embodiments as illustrated in the accompanying drawings is not intended to be limiting of the described method 600, control unit 700 and/or system 100, which instead are limited by the enclosed claims.

As used herein, the term "and/or" comprises any and all combinations of one or more of the associated listed items. In addition, the singular forms "a", "an" and "the" are to be interpreted as "at least one", thus also possibly comprising a plurality of entities of the same kind, unless expressly stated otherwise. It will be further understood that the terms "includes", "comprises", "including" and/or "comprising", specifies the presence of stated features, actions, integers, steps, operations, elements, and/or components, but do not preclude the presence or addition of one or more other features, actions, integers, steps, operations, elements, components, and/or groups thereof. The term "or" as used herein, is to be interpreted as a mathematical OR, i.e. as an inclusive disjunction; not as a mathematical exclusive OR (XOR), unless expressly stated otherwise. A single unit such as, e.g., a processor may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms such as via Internet or other wired or wireless communication system.

What is claimed is:

1. An Electro Hydro Dynamic (EHD) thruster configured to be electrically isolated from a heat sink and to generate an airflow of ionized air for cooling the heat sink, the EHD thruster comprising:
  a first set of electrodes comprising multiple parallel electrodes;
  a second set of electrodes comprising multiple parallel electrodes; wherein at least one of the multiple parallel electrodes of the second set of electrodes has a base portion and multiple tip portions extending from the base portion, the base portion is oriented substantially perpendicular to the first set of electrodes and the tip portions extending from the base portion are substantially parallel to the first set of electrodes; and
  a supporting structure comprising a containing space formed by side walls for supporting the first and second sets of electrodes disposed inside the containing space.

2. The EHD thruster according to claim 1, wherein the EHD thruster is configured to generate a push airflow in a first direction through a first part of the heat sink and a pull airflow through a second part of the heat sink.

3. The EHD thruster according to claim 1, wherein the cooling airflow of the EHD thruster is adjustable by adjusting Direct Currency (DC) voltage feed, based on an estimation of a temperature of a heat source thermally connected to the heat sink.

4. The EHD thruster according to claim 1, wherein any electrode within the first set of electrodes, or the second set of electrodes is made of metal or dielectric material covered by a metalized surface.

5. The EHD thruster according to claim 1, wherein the first set of electrodes comprises multiple line electrodes.

6. The EHD thruster according to claim 1, wherein the multiple tip portions of said at least one of the multiple parallel electrodes in the second set of electrodes are displaced with regard to the first set of electrodes, in a first direction of the airflow.

7. The EHD thruster according to claim 1, wherein the first set of electrodes comprises at least one bar electrode arranged perpendicular to the second set of electrodes.

8. The EHD thruster according to claim 1, wherein the supporting structure is open in the first direction towards the first part of the heat sink and is open in a second direction towards the second part of the heat sink, for enabling natural convection cooling of the heat sink when the EHD thruster is switched off.

9. The EHD thruster according to claim 1, wherein the second set of electrodes is connected to negative voltage and the first set of electrodes is connected to either positive voltage or ground; or wherein the second set of electrodes is connected to positive voltage and the first set of electrodes is connected to either negative voltage or ground.

10. The EHD thruster according to claim 1, wherein the supporting structure is electrically isolated from the first and second sets of electrodes and is metalized for protecting nearby electronic equipment from electromagnetic interference.

11. The EHD thruster according to claim 1, wherein the supporting structure comprises at least one grid for enclosing at least one of the groups of (a) the first set of electrodes and (b) the second set of electrodes, while enabling natural convection cooling of the heat sink by allowing the airflow through the supporting structure.

12. The EHD thruster according to claim 1, wherein the heat sink comprises a first part and a second part, and wherein the heat sink comprises a compartment, and wherein the EHD thruster is adapted to be placed the compartment for providing a push airflow in a first direction through the first part of the heat sink and a pull airflow through the second part of the heat sink.

13. The EHD thruster according to claim 1, wherein the heat sink comprises a heat base and heat sink fins, wherein the heat sink fins comprises a first fin assembly and a second fin assembly, and wherein the EHD thruster is adapted to be placed on the heat base between the first fin assembly and the second fin assembly.

14. A method in a control unit for controlling airflow generation of an Electro Hydro Dynamic (EHD) thruster configured to be electrically isolated from a heat sink and to generate an airflow of ionized air for cooling the heat sink, the method comprising:
  estimating temperature of a heat source thermally connected to the heat sink to be cooled;
  comparing the estimated temperature with a threshold limit; and
  adjusting the voltage feed level of a Direct Currency (DC) power supply unit to the first and second sets of electrodes, based on the comparison;
  wherein the EHD thruster comprises:
  a first set of electrodes comprising multiple parallel electrodes;
  a second set of electrodes comprising multiple parallel electrodes; wherein at least one of the multiple parallel electrodes of the second set of electrodes has a base portion and multiple tip portions extending from the base portion, the base portion is oriented substantially perpendicular to the first set of electrodes and the tip portions extending from the base portion are substantially parallel to the first set of electrodes; and
  a supporting structure comprising a containing space formed by side walls for supporting the first and second sets of electrodes disposed inside the containing space.

15. The method according to claim 14, wherein the adjustment of the voltage feed level comprises generating pulse width modulation signals in the control unit and transmitting the pulse width modulation signals to the DC power supply unit, which is enabled to accordingly adjust DC current feed to the first and second sets of electrodes of the EHD thruster.

16. The method according to claim 14, wherein said airflow comprises a pull airflow enabled by the EHD thruster, placed between the first part and the second part of the heat sink, by decreasing local air pressure resulting in a cold airstream through the heat sink.

17. A system comprising an Electro Hydro Dynamic (EHD) thruster and a heat sink, wherein the EHD thruster is configured to be electrically isolated from the heat sink and to generate an airflow of ionized air for cooling the heat sink, wherein the EHD thruster comprises:

a first set of electrodes comprising multiple parallel electrodes;

a second set of electrodes comprising multiple parallel electrodes; wherein at least one of the multiple parallel electrodes of the second set of electrodes has a base portion and multiple tip portions extending from the base portion, the base portion is oriented substantially perpendicular to the first set of electrodes and the tip portions extending from the base portion are substantially parallel to the first set of electrodes; and a supporting structure comprising a containing space formed by side walls for supporting the first and second sets of electrodes disposed inside the containing space.

18. The system comprising the EHD thruster according to claim 17, wherein the heat sink is electrically grounded and comprises a first part and a second part, a compartment for holding the EHD thrusters for providing a push airflow in a first direction through the first part of the heat sink and a pull airflow through the second part of the heat sink.

19. The system according to claim 17, further comprising a Direct Currency (DC) power supply unit configured for providing a DC current to the first and second sets of electrodes of the EHD thruster.

20. The system according to claim 19, also comprising a control unit, and wherein the DC power supply unit is configured to convert a DC input to a variable higher voltage DC output, where the level of the higher voltage DC output is controlled by the control unit.

21. The system according to claim 19, further comprising a short cut detector and wherein the DC power supply unit is configured to disable the voltage feed when a short cut behaviour is detected and to enable the voltage feed of the DC power supply unit when no short cut is detected.

22. The system according to claim 17, wherein the heat sink comprises a heat base and heat sink fins, wherein the heat sink fins comprises a first fin assembly and a second fin assembly, and wherein the EHD thruster is adapted to be placed on the heat base between the first fin assembly and the second fin assembly.

23. A method for cooling a heat sink comprising:

electrically isolating an Electro Hydro Dynamic (EHD) thruster from the heat sink;

generating, by the EHD thruster, an airflow of ionised air for cooling the heat sink, wherein the EHD thruster comprises:

a first set of electrodes comprising multiple parallel electrodes;

a second set of electrodes comprising multiple parallel electrodes, wherein at least one of the multiple parallel electrodes of the second set of electrodes has a base portion and multiple tip portions extending from the base portion the base portion is oriented substantially perpendicular to the first set of electrodes and the tip portions extending from the base portion are substantially parallel to the first set of electrodes; and a supporting structure comprising a containing space formed by side walls for supporting the first and the second sets of electrodes disposed inside the containing space.

24. The method according to claim 23, further comprising:

estimating a temperature of a heat source thermally connected to the heat sink to be cooled;

comparing the estimated temperature with a threshold limit; and adjusting the voltage feed level to the first and second sets of electrodes, based on the comparison.

25. The method according to claim 24 wherein the adjustment of the voltage feed level comprises: generating and transmitting pulse width modulation signals to a DC power supply unit, which is enabled to accordingly adjust DC current feed to the first and second sets of electrodes of the EHD thruster.

26. The method according to claim 23, wherein said airflow comprises a pull airflow enabled by the EHD thruster, placed between the first part and the second part of the heat sink, by decreasing local air pressure resulting in a cold airstream through the heat sink.

* * * * *